United States Patent
Wei et al.

(10) Patent No.: US 12,426,307 B2
(45) Date of Patent: Sep. 23, 2025

(54) DUAL METAL GATE STRUCTURES ON NANORIBBON SEMICONDUCTOR DEVICES

(71) Applicant: Intel Corporation, Santa Clara, CA (US)

(72) Inventors: Andy Chih-Hung Wei, Yamhill, OR (US); Yang-Chun Cheng, Portland, OR (US); Dax M. Crum, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 878 days.

(21) Appl. No.: 17/460,524

(22) Filed: Aug. 30, 2021

(65) Prior Publication Data
US 2023/0062210 A1    Mar. 2, 2023

(51) Int. Cl.
*H10D 62/10*       (2025.01)
*H10D 30/67*       (2025.01)
*H10D 64/68*       (2025.01)
*H10D 84/01*       (2025.01)
*H10D 84/03*       (2025.01)
*H10D 84/85*       (2025.01)

(52) U.S. Cl.
CPC ..... *H10D 30/6735* (2025.01); *H10D 30/6757* (2025.01); *H10D 62/118* (2025.01); *H10D 64/691* (2025.01); *H10D 84/0128* (2025.01); *H10D 84/014* (2025.01); *H10D 84/0144* (2025.01); *H10D 84/038* (2025.01); *H10D 84/85* (2025.01)

(58) Field of Classification Search
None
See application file for complete search history.

(56) References Cited

U.S. PATENT DOCUMENTS

| 2012/0049297 | A1  | 3/2012 | Takeoka |
| 2018/0090496 | A1* | 3/2018 | Cheng ............... H10D 84/0193 |

(Continued)

OTHER PUBLICATIONS

Extended European Search Report received for EP Application No. 22187914.1 dated Apr. 17, 2023. 13 pages.

(Continued)

*Primary Examiner* — Xiaoming Liu
(74) *Attorney, Agent, or Firm* — Finch & Maloney PLLC

(57) ABSTRACT

Techniques are provided herein to form semiconductor devices having different work function metals over different devices. The techniques can be used in any number of integrated circuit applications and are particularly useful with respect to gate-all-around (GAA) transistors. In an example, neighboring semiconductor devices each include a different work function to act as the device gate electrode for each semiconductor device. More specifically, a first semiconductor device may be a p-channel GAA transistor with a first work function metal around the various nanoribbons of the transistor, while the second neighboring semiconductor device may be an n-channel GAA transistor with a second work function metal around the various nanoribbons of the transistor. No portions of the first work function metal are present around the nanoribbons of the second semiconductor device and no portions of the second work function metal are present around the nanoribbons of the first semiconductor device.

20 Claims, 12 Drawing Sheets

(56) References Cited

U.S. PATENT DOCUMENTS

| | | | |
|---|---|---|---|
| 2019/0088798 A1* | 3/2019 | Kim | H10D 62/364 |
| 2020/0105534 A1 | 4/2020 | Wang et al. | |
| 2021/0028068 A1 | 1/2021 | Dentoni Litta et al. | |
| 2021/0134794 A1* | 5/2021 | Huang | H10D 30/031 |
| 2021/0202323 A1* | 7/2021 | Wu | H10D 84/0128 |
| 2021/0313333 A1* | 10/2021 | Liaw | H10D 30/43 |

OTHER PUBLICATIONS

Partial European Search Report received for EP Application No. 22187914.1 dated Jan. 16, 2023. 16 pages.
Spessot, et al., "Device Scaling roadmap and its implications for Logic and Analog platform," 2020 IEEE BiCMOS and Compound Semiconductor Integrated Circuits and Technology Symposium. IEEE, Nov. 15, 2020. 8 pages.

* cited by examiner

US 12,426,307 B2

DUAL METAL GATE STRUCTURES ON NANORIBBON SEMICONDUCTOR DEVICES

FIELD OF THE DISCLOSURE

The present disclosure relates to integrated circuits, and more particularly, to metal gate structures of different semiconductor devices.

BACKGROUND

As integrated circuits continue to scale downward in size, a number of challenges arise. For instance, reducing the size of memory and logic cells is becoming increasingly more difficult. In some situations, different metals are deposited over different transistor devices. For example, p-channel transistors may use a gate with a first (p-type) metal while n-channel transistors may use a gate with a second (n-type) metal different from the first metal. For some transistor architectures, performing multiple deposition steps to lay down different metals across the integrated circuit can lead to uneven metal distribution around the channel portions of certain transistors, which can have a negative effect on the threshold voltage for the transistors. Accordingly, there remain a number of non-trivial challenges with respect to metal gate fabrication in semiconductor devices.

Figure 1A:
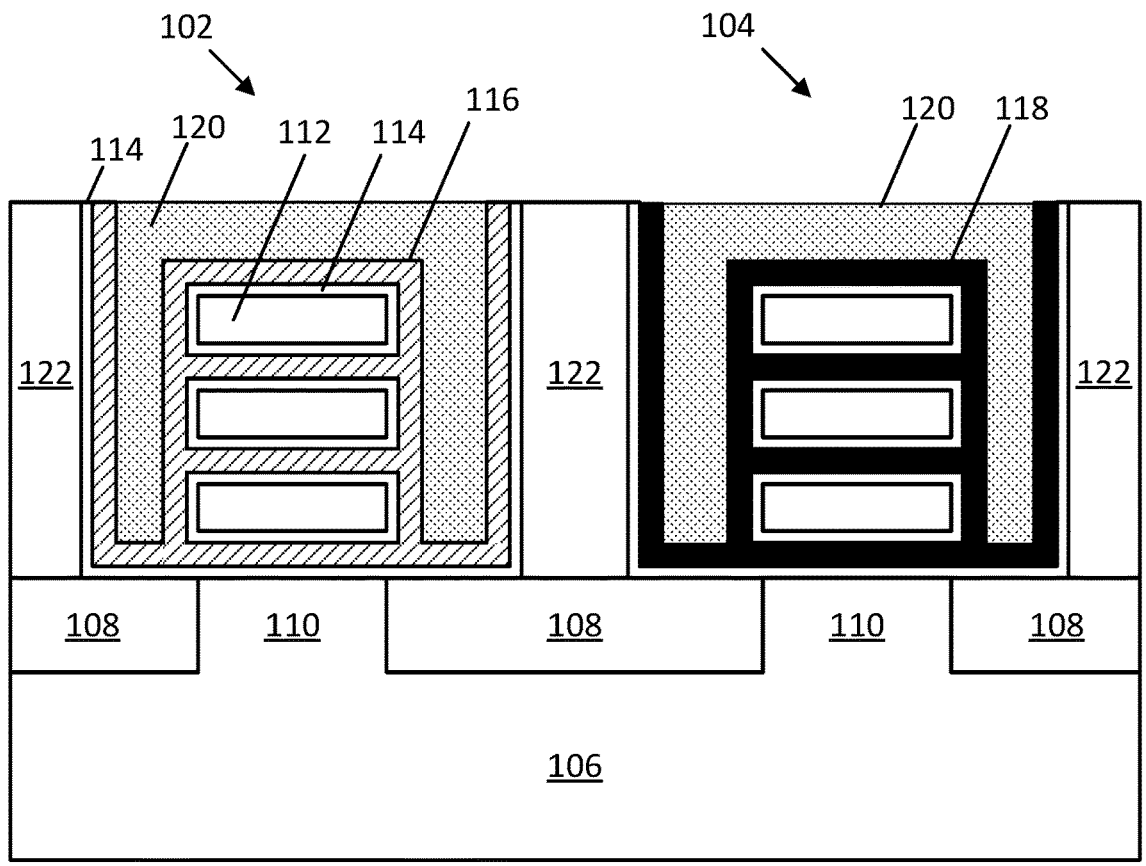
FIGS. 1A and 1B are cross-sectional and plan views of some semiconductor devices that illustrate the use of different gate materials, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles, and some features may have surface topology or otherwise be non-smooth, given real world limitations of the processing equipment and techniques used.

DETAILED DESCRIPTION

Techniques are provided herein to form semiconductor devices having different work function metals over different devices. The techniques can be used in any number of integrated circuit applications and are particularly useful with respect to logic and memory cells, such as those cells that use gate-all-around (GAA) transistors. In an example, a pair of laterally neighboring semiconductor devices are arranged in a complementary metal oxide semiconductor (CMOS) configuration, and each device of the pair includes a different work function metal to act as the device gate electrode for each semiconductor device. More specifically, a first semiconductor device may be a p-channel GAA transistor with a first (p-type) work function metal around the one or more nanoribbons of the transistor, while the second neighboring semiconductor device may be an n-channel GAA transistor with a second (n-type) work function metal around the one or more nanoribbons of the transistor. In some cases, the gate electrodes may further include gate fill material to fill any remaining portion of the gate electrodes not filled by work function metal. The gate fill material may be the same for both devices. According to an embodiment, no portions of the first work function metal are present around the nanoribbons of the second semiconductor device and likewise no portions of the second work function metal are present around the nanoribbons of the first semiconductor device. In this sense, there is no stacking or overlap of the first and second work function metals, thus allowing the thicknesses of the first and second work function metals to be controlled independently of one another. Numerous variations and embodiments will be apparent in light of this disclosure.

General Overview

As previously noted above, there remain a number of non-trivial challenges with respect to metal gate fabrication in semiconductor devices. One type of dual-metal gate fabrication process involves the deposition of a first work function metal everywhere (such as over the nanoribbons of neighboring first and second semiconductor devices), the removal of the first work function metal from some of the devices (such as from over the second semiconductor device while keeping the metal over the first semiconductor device), and the deposition of a second work function metal everywhere. This results in some devices (such as the first semiconductor device) having both work function metals around the nanoribbons of the transistor of the first semiconductor device and other devices (such as the second semiconductor device) having only the second work function metal around the nanoribbons of the transistor of the second semiconductor device. Due to the gate-all around design of the transistors, the spaces between the nanoribbons of the first semiconductor device are filled with the first deposited work function metal while any further deposited metals (e.g., the second work function metal) deposit on the top and sides of the nanoribbon stack, but not between the nanoribbons. This type of metal gate structure can lead to different threshold voltages between the nanoribbons compared to the edge of the nanoribbons.

Thus, and in accordance with an embodiment of the present disclosure, techniques are provided herein to form different work function gate materials over different semiconductor devices, including over neighboring semiconductor devices, such that the work function metal of a first semiconductor device is not present over a second neighboring semiconductor device and vice-versa (e.g., no overlap or stacking of work function metals). For example, neighboring n-channel and p-channel semiconductor devices may have their gates electrically coupled together, and yet use different work function metals around the nanoribbons of each of the semiconductor devices. According to some embodiments, the techniques described herein leverage the use of a dielectric wall between adjacent first and second semiconductor devices to isolate the semiconductor devices from one another when depositing a first work function metal over both the first and second semiconductor devices and subsequently clearing the first work function metal away from only the second semiconductor device. In some embodiments, the dielectric wall can be removed to allow a second work function metal around the second semiconductor device to be electrically coupled to the first work function metal of the first semiconductor device.

The different work function metals may be used over semiconductor devices having gate dielectric layers that contain different material concentrations in order to change the threshold voltages of the different semiconductor devices. For example, the first semiconductor device may include a gate dielectric layer of hafnium oxide ($HfO_2$) with a first concentration of lanthanum (La) while the second semiconductor device may include a gate dielectric layer of $HfO_2$ with a second concentration of lanthanum different from the first concentration (e.g., more than 5% different). Other doping elements similar to lanthanum may be used as well to affect the threshold voltages of the given semiconductor devices.

According to an embodiment, an integrated circuit includes a first semiconductor device having a first plurality of semiconductor nanoribbons extending between a first source region and a first drain region, and a second semiconductor device having a second plurality of semiconductor nanoribbons extending between a second source region and a second drain region. The second plurality of semiconductor nanoribbons effectively extend in the same direction as the first plurality of semiconductor nanoribbons. The integrated circuit further includes a first conductive material surrounding at least a portion of the first plurality of semiconductor nanoribbons such that the first conductive material is between adjacent nanoribbons of the first plurality of semiconductor nanoribbons, and a second conductive material different from the first conductive material, the second conductive material surrounding at least a portion of the second plurality of semiconductor nanoribbons such that the second conductive material is between adjacent nanoribbons of the second plurality of semiconductor nanoribbons. A third conductive material is on both the first and second conductive materials.

According to another embodiment, a method of forming an integrated circuit includes forming a first conductive layer around a first plurality of semiconductor nanoribbons of a first semiconductor device and around a second plurality of semiconductor nanoribbons of a second semiconductor device, the first semiconductor device being separated from the second semiconductor device by a dielectric wall; removing the first conductive layer from around the second plurality of semiconductor nanoribbons; removing the dielectric wall from between the first and second semiconductor devices; forming a second conductive layer around the second plurality of semiconductor nanoribbons, the second conductive layer having a different conductive material than the first conductive layer around the first plurality of semiconductor nanoribbons; and forming a third conductive layer over both the first conductive layer and the second conductive layer.

The techniques are especially well-suited for use with nanowire and nanoribbon transistors (e.g., gate-all-around transistors), but may also be applicable in some instances to finFET devices. The source and drain regions can be, for example, doped portions of a given fin or substrate, or epitaxial regions that are deposited during an etch-and-replace source/drain forming process. The dopant-type in the source and drain regions will depend on the polarity of the corresponding transistor. The gate structure can be implemented with a gate-first process or a gate-last process (sometimes called a remove metal gate, or RMG, process). Any number of semiconductor materials can be used in forming the transistors, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate an absence of any stacked or overlapping work function metals GAA devices. In some embodiments, the first or second work function metals of laterally adjacent (neighboring) semiconductor devices may form a conductive wall between the neighboring semiconductor devices where a third fill metal is present on both sides of the wall. Note that, in some such embodiments, there is high-k gate dielectric material wrapped around the respective channel regions but not on this conductive wall. In some embodiments, the first work function metal around the first semiconductor device may form a protruding structure beneath the conductive wall where it contacts the second work function metal. Numerous configurations and variations will be apparent in light of this disclosure.

Architecture

Figure 1B:
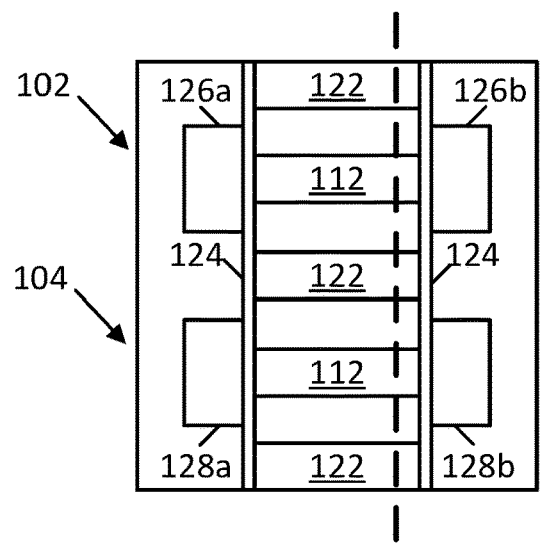

FIG. 1A is a cross sectional view taken across two example semiconductor devices 102 and 104, according to an embodiment of the present disclosure. FIG. 1B is a top-down view of the adjacent semiconductor devices 102 and 104 where FIG. 1A illustrates the cross section taken across the thick dotted line. For clarity, the conductive layers that make up gate structure and the gate dielectric layers are not shown in the top-down view of FIG. 1B. Each of semiconductor devices 102 and 104 may be non-planar metal oxide semiconductor (MOS) transistors, such as tri-gate or gate-all-around (GAA) transistors, although other transistor topologies and types could also benefit from the techniques provided herein. The illustrated embodiments herein use the GAA structure. Semiconductor devices 102 and 104 represent a portion of an integrated circuit that may contain any number of similar semiconductor devices.

As can be seen, semiconductor devices 102 and 104 are formed on a substrate 106. Any number of semiconductor devices can be formed on substrate 106, but two are used here as an example. Substrate 106 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, the substrate can be a semiconductor-on-insulator substrate having a desired semiconductor layer over a buried insulator layer (e.g., silicon over silicon dioxide). Alternatively, the substrate can be a multilayer substrate or superlattice suitable for forming nanowires or nanoribbons (e.g., alternating layers of silicon and SiGe, or alternating layers indium gallium arsenide and indium phosphide). Any number of substrates can be used.

The semiconductor material in each of semiconductor devices 102 and 104 may be formed from substrate 106. Semiconductor devices 102 and 104 may each include fins or semiconductor material as nanowires or nanoribbons that can be, for example, native to substrate 106 (formed from the substrate itself). Alternatively, the fins or semiconductor material can be formed of material deposited onto an underlying substrate. In one such example case, a blanket layer of silicon germanium (SiGe) can be deposited onto a silicon substrate, and then patterned and etched to form a plurality of SiGe fins or nanoribbons. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fins include alternating layers of material (e.g., alternating layers of silicon and SiGe) that facilitates forming of nanowires and nanoribbons during a gate forming process where one type of the alternating layers are selectively etched away so as to liberate the other type of alternating layers within the channel region, so that a gate-all-around (GAA) process can then be carried out.

As can further be seen, adjacent semiconductor devices are separated by a dielectric fill 108 that may include silicon oxide. Dielectric fill 108 provides shallow trench isolation (STI) between any adjacent semiconductor devices. Dielectric fill 108 can be any suitable dielectric material, such as silicon dioxide, aluminum oxide, or silicon oxycarbonitride.

Focusing on semiconductor device 102, but also applicable to semiconductor device 104, semiconductor device 102 includes a subfin region 110 and a plurality of nanoribbons 112 above the subfin region 110. According to some embodiments, subfin region 110 comprises the same semiconductor material as substrate 106 and is adjacent to dielectric fill 108. According to some embodiments, nanoribbons 112 extend between a source and a drain region to provide an active region for a transistor (e.g., the semiconductor region beneath the gate). The source and drain regions are not shown in the cross-section of FIG. 1A, but are seen in the top-down view of FIG. 1B where nanoribbons 112 of semiconductor device 102 extend between a source region 126a and a drain region 126b (similarly, the nanoribbons 112 of semiconductor device 104 extend between a source region 128a and a drain region 128b). FIG. 1B also illustrates spacer structures 124 on either end of each of semiconductor device 102 and semiconductor device 104 as would be understood to a person skilled in the relevant art. Spacer structures 124 may include a dielectric material, such as silicon nitride.

According to some embodiments, the source and drain regions are epitaxial regions that are provided using an etch-and-replace process. In other embodiments one or both of the source and drain regions could be, for example, implantation-doped native portions of the semiconductor fins or substrate. Any semiconductor materials suitable for source and drain regions can be used (e.g., group IV and group III-V semiconductor materials). The source and drain regions may include multiple layers such as liners and capping layers to improve contact resistance. In any such cases, the composition and doping of the source and drain regions may be the same or different, depending on the polarity of the transistors. In an example, for instance, one transistor is a p-type MOS (PMOS) transistor, and the other transistor is an n-type MOS (NMOS) transistor. Any number of source and drain configurations and materials can be used.

Focusing again on semiconductor device 102, nanoribbons 112 include a gate dielectric 114 that may include a single material layer or multiple stacked material layers. In some embodiments, gate dielectric 114 includes a first dielectric layer such as silicon oxide and a second dielectric layer that includes a high-K material such as hafnium oxide. As noted above, the hafnium oxide may be doped with an element to affect the threshold voltage of the given semiconductor device. In some embodiments, the gate dielectric 114 around semiconductor device 102 has a different element doping concentration compared to the gate dielectric 114 around semiconductor device 104. According to some embodiments, the doping element used in gate dielectric 114 is lanthanum. The process used to form the differently-doped portions of gate dielectric 114 is described in more detail with reference to FIGS. 2A-2D. Gate dielectric 114 is present around each nanoribbon 112 and may also be present along the sidewalls of adjacent dielectric walls 122.

According to some embodiments, a first conductive material 116 acts as a first work function gate around nanoribbons 112 of first semiconductor device 102 and a second conductive material 118 acts as a second work function gate around nanoribbons 112 of second semiconductor device 104. In some embodiments, semiconductor device 102 is an n-channel device and first conductive material 116 is an n-channel work function metal that includes titanium. In one example, first conductive material 116 includes titanium, aluminum, carbon, and oxygen (TiAlCO). In some embodiments, semiconductor device 104 is a p-channel device and second conductive material 116 is a p-channel work function metal that includes tungsten. Other metals or sufficiently conductive materials may be used as well for either the n-channel or p-channel devices. A fill metal 120 may be present on both first conductive material 116 and second conductive material 118. Fill metal 120 may include tungsten (W) or a combination of titanium nitride (TiN) and tungsten (W), to name a few examples. The combination of fill metal 120 and first conductive material 116 forms a first gate structure for semiconductor device 102 and the combination of fill metal 120 and second conductive material 118 form a second gate structure for semiconductor device 104. Due to the formation process disclosed herein, no stack of different work function metals is present over either first semiconductor device 102 or second semiconductor device 104. In other words, no portion of first conductive material 116 is present around the nanoribbons of second semiconductor device 104 and no portion of second conductive material 118 is present around the nanoribbons of first semiconductor device 102.

According to some embodiments, a dielectric wall 122 is present along ends of the gate structures for both semiconductor devices 102 and 104. As seen more clearly in FIG. 1B, dielectric wall 122 may separate the gate structures of semiconductor devices 102 and 104 such that a given semiconductor device can sit within its own "well" formed by four connecting dielectric walls (e.g., two sides made by dielectric walls 122 and two sides made by spacer structures 124). These dielectric walls 122 may include any composition of silicon and nitrogen or any other dielectric material that exhibits high etch selectivity to silicon oxide. In some embodiments, dielectric walls 122 include the same material as spacer structures 124. Dielectric walls 122 can act as gate cut structures that isolate neighboring semiconductor device gates from one another, such as the example illustrated in FIGS. 1A and 1B.

Figure 1C:
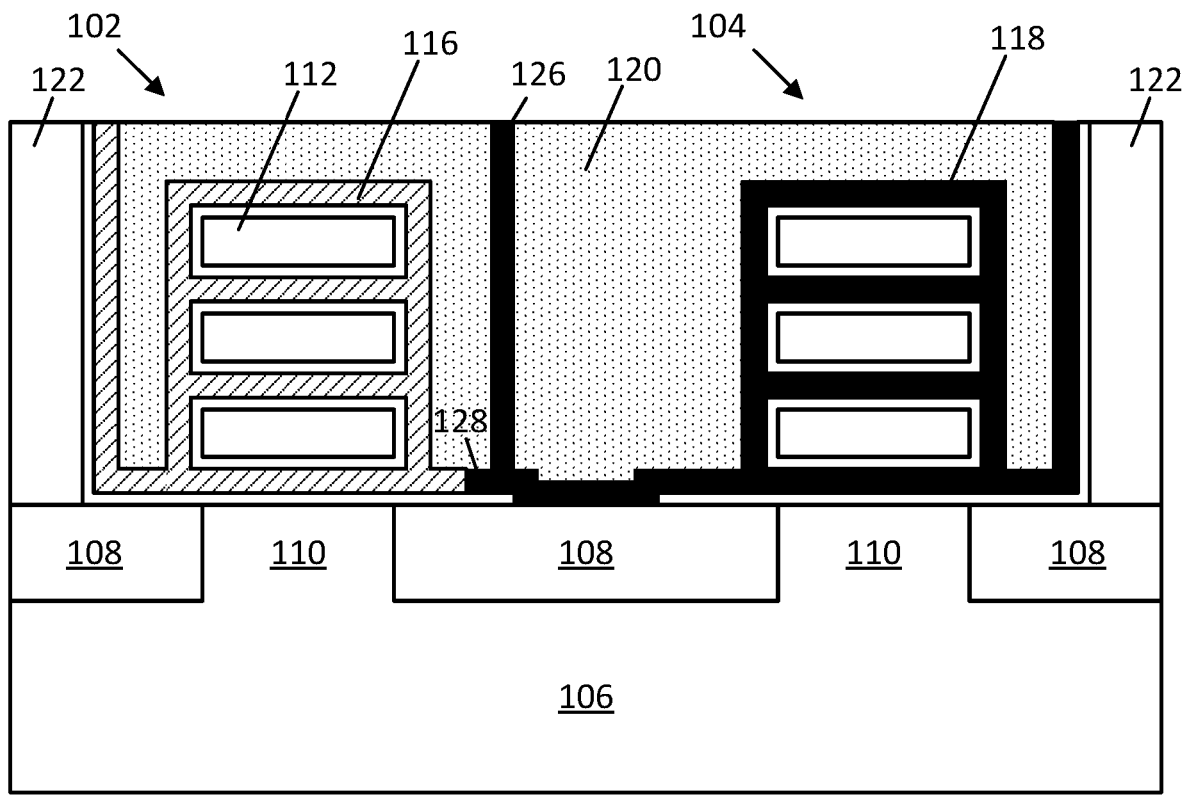
FIGS. 1C and 1D are cross-sectional and plan views of some semiconductor devices with connected gates that illustrate the use of different gate materials, in accordance with an embodiment of the present disclosure.
Figure 1D:
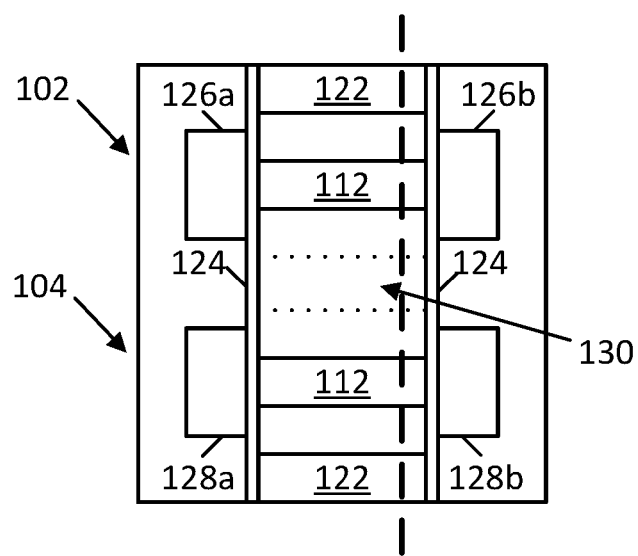

FIG. 1C illustrates another embodiment using semiconductor devices 102 and 104 where the dielectric wall 122 between their gate structures has been removed such that their gate structures are electrically coupled together. FIG. 1D is a top-down view of the adjacent semiconductor devices 102 and 104 where FIG. 1C illustrates the cross section taken across the thick dotted line. For clarity, the conductive layers that make up gate structure and the gate dielectric layers are not shown in the top-down view of FIG. 1D. The previous discussion with regards to the features of semiconductor devices 102 and 104 applies to this example. Accordingly, first conductive material 116 surrounds nanoribbons 112 of first semiconductor device 102, second conductive material 118 surrounds nanoribbons 112 of second semiconductor device 104, and fill metal 120 extends over both work function metals. Since dielectric wall 122 between the gate structures of semiconductor devices 102 and 104 has been removed, fill metal 120 extends across both semiconductor devices 102 and 104 to ensure that the gates are electrically coupled together. As seen in FIG. 1D, region 130 identifies the location where dielectric wall 122 has been removed.

Due to the fabrication process involved for removing the dielectric wall and forming the different work function metals, some distinguishing features are formed in this embodiment. For example, second conductive material 118 forms a conductive wall 126 between semiconductor devices 102 and 104 where fill metal 120 contacts both sides of conductive wall 126. In another example, second conductive material 118 includes a protruding structure 128 that extends away from conductive wall 126 and contacts first conductive material 116. More details regarding the fabrication process that produces these features are provided herein with reference to FIGS. 3A-3G. It should be understood that this example illustrates conductive wall 126 and protruding structure 128 being formed from second conductive material 118, but such structures may also be formed from first conductive material 116

Fabrication Methodology

FIGS. 2A-2D include cross-sectional and top-down views that collectively illustrate an example process for forming an integrated circuit configured with semiconductor devices having gate dielectrics with differing dopant concentrations, in accordance with an embodiment of the present disclosure. This process is provided to illustrate how gate dielectric layers with different dopant concentrations are formed, and may be performed prior to forming the different work function metals over different semiconductor devices. Each figure shows an example structure that results from the process flow up to that point in time, so the depicted structure evolves as the process flow continues, culminating in the structure shown in FIG. 2D. The illustrated integrated circuit structure may be part of a larger integrated circuit that includes other integrated circuitry not depicted. Example materials and process parameters are given, but the present disclosure is not intended to be limited to any specific such materials or parameters, as will be appreciated.

Figure 2A:
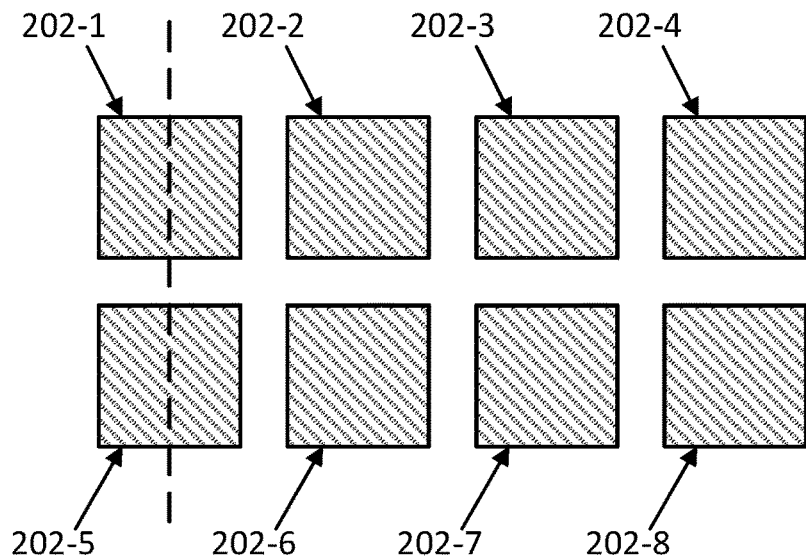
FIGS. 2A-2D are cross-sectional and plan views that illustrate various stages in an example process for forming gate dielectric layers having different material compositions, in accordance with an embodiment of the present disclosure.
Figure 2A:
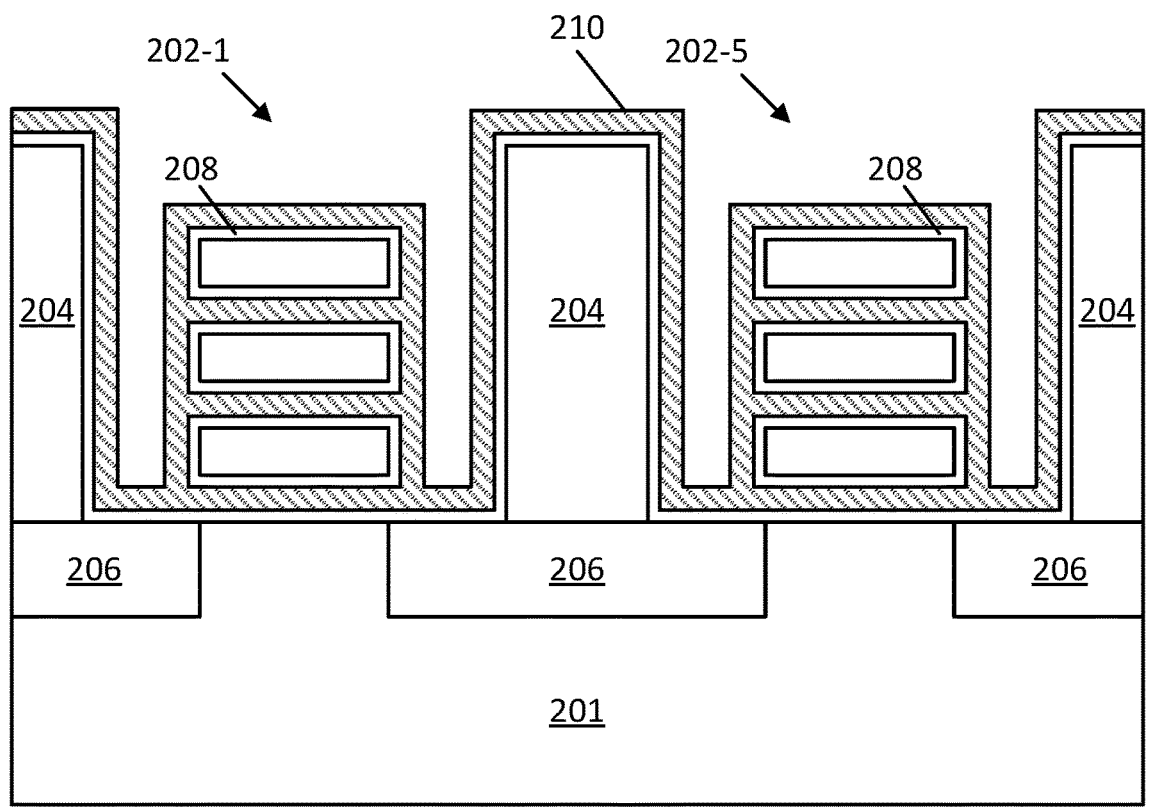

FIG. 2A illustrates a top-down view of a series of semiconductor devices 202-1-202-8. FIG. 2A also provides a cross-section view taken across the dotted line in the top-down view. The top-down view illustrates an example arrangement of the semiconductor devices and also illustrates an example masking procedure and metal deposition procedure across the various semiconductor devices. The cross-section view is similar to the cross-section view shown in FIG. 1A and the description of the various semiconductor structures in FIG. 1A is equally applicable in this example. Accordingly, two semiconductor devices 202-1 and 202-5 are illustrated in the cross-section view. Such semiconductor devices are formed from or formed on a substrate 201 which may be similar to substrate 106 described above. Furthermore, a dielectric fill 206 acts as a shallow trench isolation (STI) similar to dielectric fill 108 described above. Additionally, dielectric wall 204 may be similar to dielectric wall 122 described above.

Semiconductor devices 202-1-202-8 may include a particular arrangement of n-channel and p-channel devices. For example, the top row of devices (202-1-202-4) may each be p-channel devices while the bottom row of devices (202-5-202-8) may each be n-channel devices. Furthermore, as will be discussed in more detail herein, different devices may have different threshold voltages based on a doping concentration used in the gate dielectric layer. For example, in any given row, the semiconductor devices may exhibit decreasing threshold voltages (e.g., device 202-1 has a highest threshold voltage while device 202-4 has a lowest threshold voltage). Other threshold voltage arrangements are possible as well.

According to some embodiments, a gate dielectric layer 208 is formed over all exposed surfaces which include the nanoribbons of various semiconductor devices and along the surfaces of dielectric wall 122. Gate dielectric layer 208 may represent a single dielectric material layer or a stack of dielectric materials. In some embodiments, gate dielectric layer 208 includes at least one layer that has a high-K dielectric material, such as hafnium oxide. Gate dielectric layer 208 may have a thickness between about 2 nm and about 5 nm and may be conformally deposited over the entire structure using atomic layer deposition (ALD), chemical vapor deposition (CVD), or plasma-enhanced chemical vapor deposition (PECVD). The gate dielectric layer 208 is initially formed without any dopant material (e.g., lanthanum). The dopant will be diffused into gate dielectric layer 208 during a later anneal process.

According to some embodiments, a first seed structure 210 is deposited over all devices 202-1-202-8. First seed structure 210 may include a stack of conductive layers, such as at least one conductive layer that includes the dopant element to be diffused into the underlying gate dielectric layer 208. In an embodiment, first seed structure 210 includes a layer of lanthanum directly on the gate dielectric layer 208, and a capping layer of titanium nitride (TiN). According to some embodiments, the layer of lanthanum has a thickness of around 6 Å and the capping layer of TiN has a thickness of around 10 Å. First seed structure 210 may be deposited using any known metal deposition technique, such as CVD, ALD, or PECVD. For clarity, the top down view shows the first seed structure 210 only over each of the various devices 202-1-202-8 and not also on the top surface of dielectric wall 204.

Figure 2B:
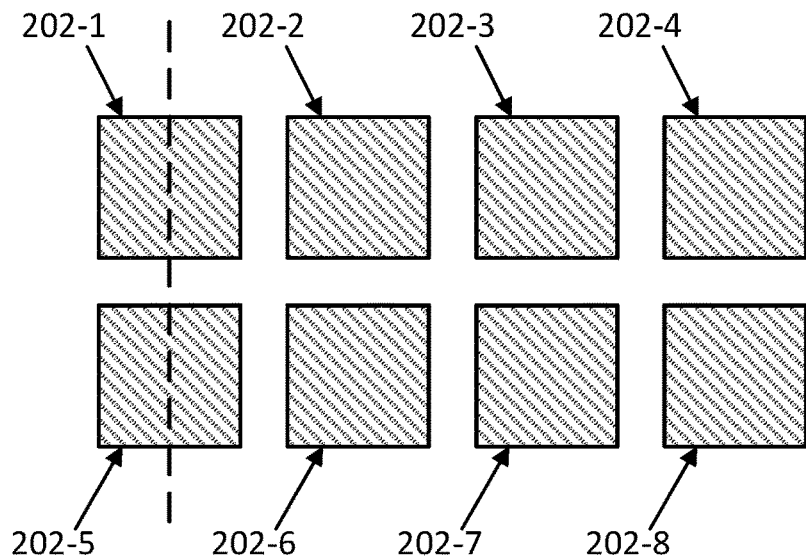
Figure 2B:
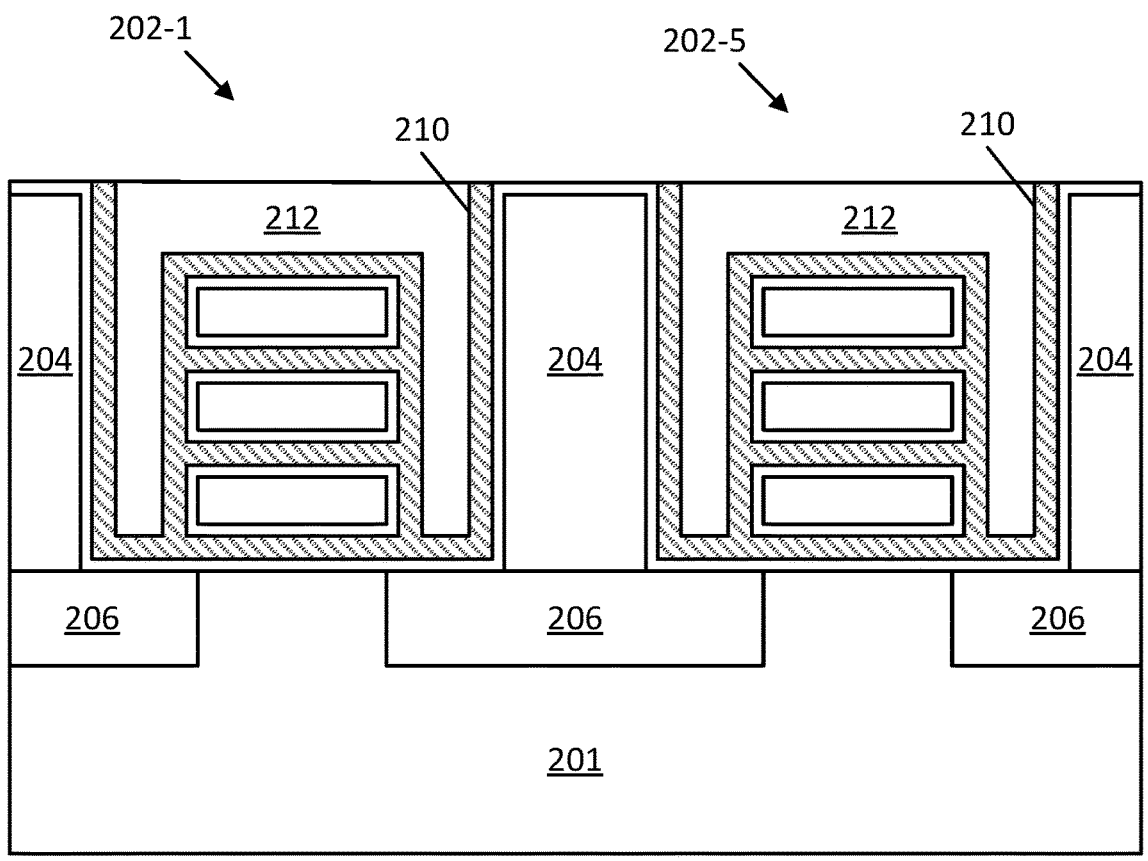

FIG. 2B illustrates top-down and cross-sectional views of the structure depicted in FIG. 2A, after depositing a dielectric fill 212 and polishing down the top surface of the structure, according to an embodiment of the present disclosure. Dielectric fill 212 may be deposited over any of devices 202-1-202-8 using any known deposition technique, such as CVD, flowable CVD, spin-on dielectric, ALD, or PECVD. In some embodiments, dielectric fill 212 is silicon oxide although any other dielectric materials may be used as well. Following the deposition of dielectric fill 212, any excess dielectric fill 212 above the top surface of dielectric wall 204 is removed along with the layer of first seed structure 210 over the top surface of dielectric wall 204. Polishing may be performed using one or more rounds of chemical mechanical polishing (CMP) to produce a planarized top surface. In some examples, gate dielectric layer 208 remains along the top surfaces of dielectric wall 204 following the polishing process. In some examples, gate dielectric layer 208 is removed from the top surfaces of dielectric wall 204 by the polishing process.

Figure 2C:
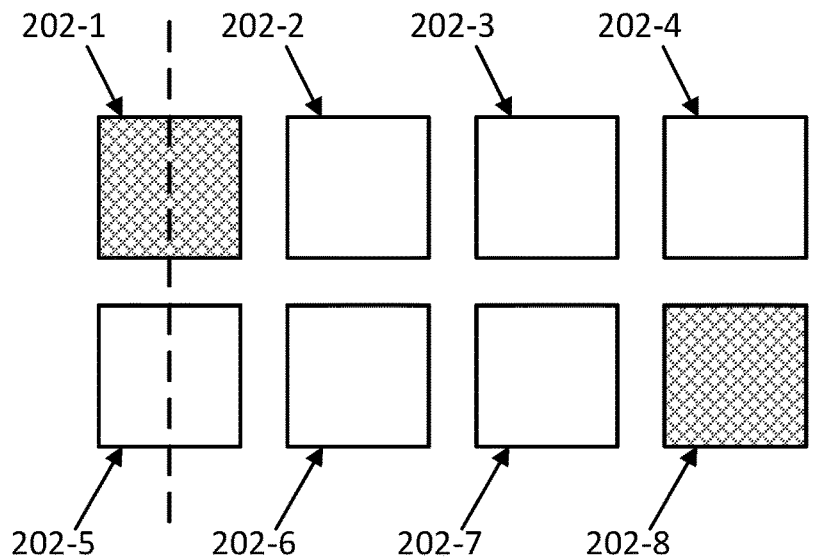
Figure 2C:
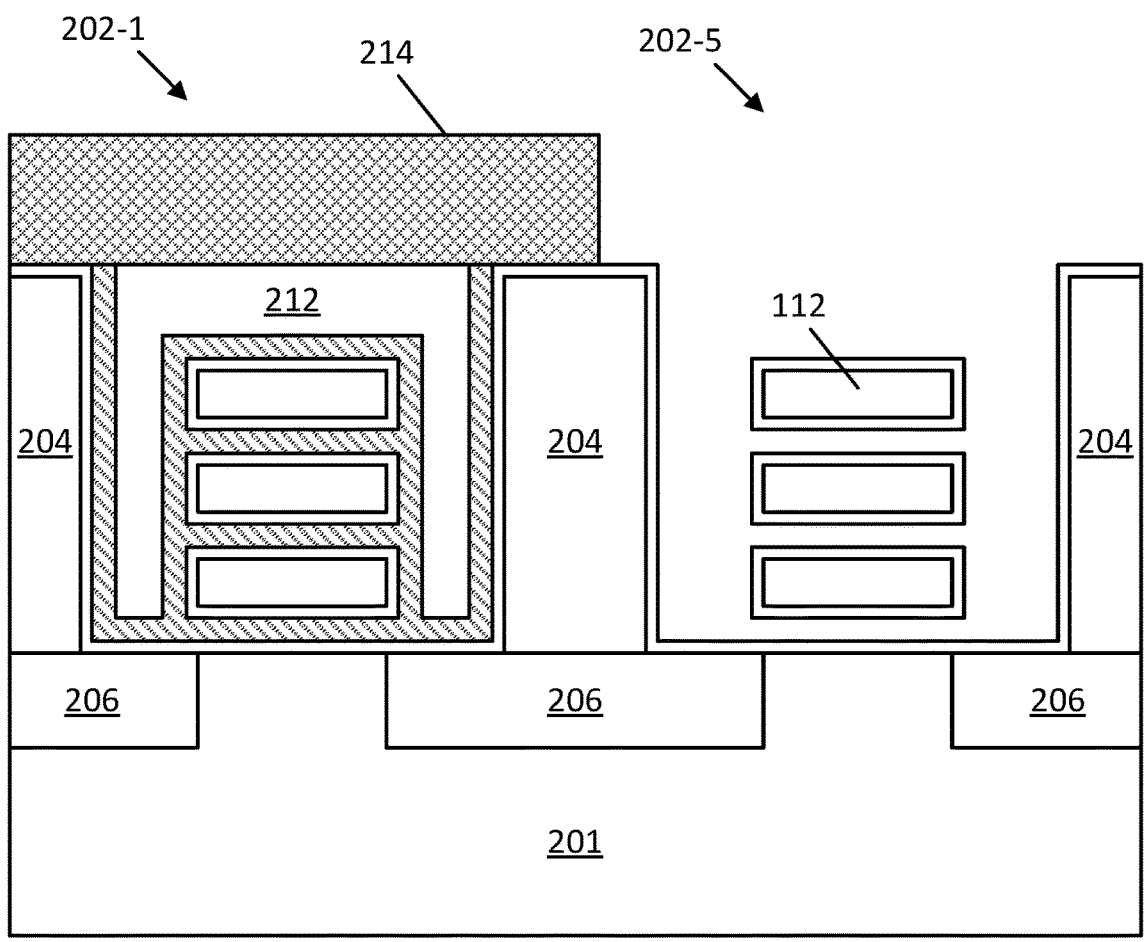

FIG. 2C illustrates top-down and cross-sectional views of the structure depicted in FIG. 2B, after masking some of the devices and removing first seed structure 210 from the unmasked devices, according to an embodiment of the present disclosure. A mask layer 214 may be deposited and patterned using known lithography techniques to protect one or more of devices 202-1-202-8. In the illustrated example, mask layer 214 is formed only over semiconductor device 202-1 and semiconductor device 202-8 while leaving the other semiconductor devices exposed. Mask layer 214 may be any type of photoresist or a hard mask material, such as a carbon hard mask (CHM).

According to some embodiments, both dielectric fill 212 and first seed structure 210 are stripped away from each of the exposed semiconductor devices not covered by mask layer 214. An isotropic wet or dry etch may be used to remove all exposed portions of first seed structure 210, including between the nanoribbons 112. In this example, after the removal process is performed, only semiconductor devices 202-1 and 202-8 have first seed structure 210 while the other semiconductor devices are ready to receive different seed structures. Once the exposed portions of first seed structure 210 have been removed, mask layer 214 may be removed using an ash process or a wet etching process.

Figure 2D:
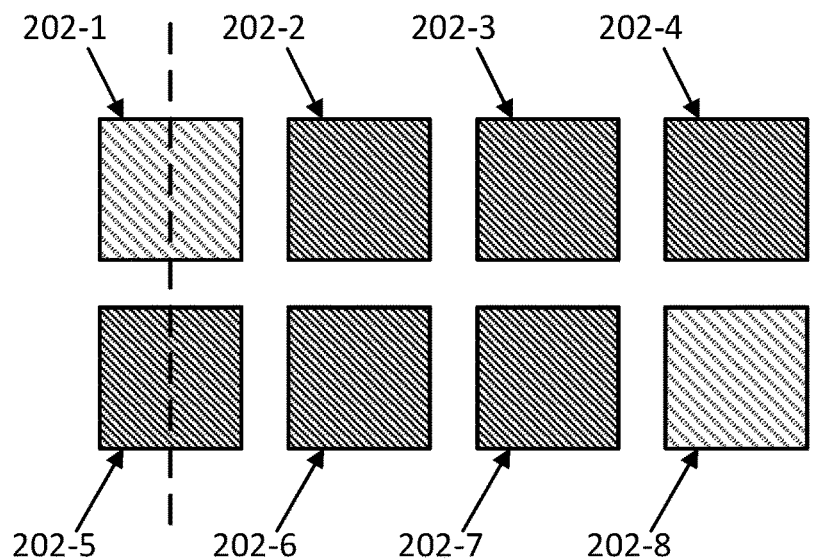
Figure 2D:
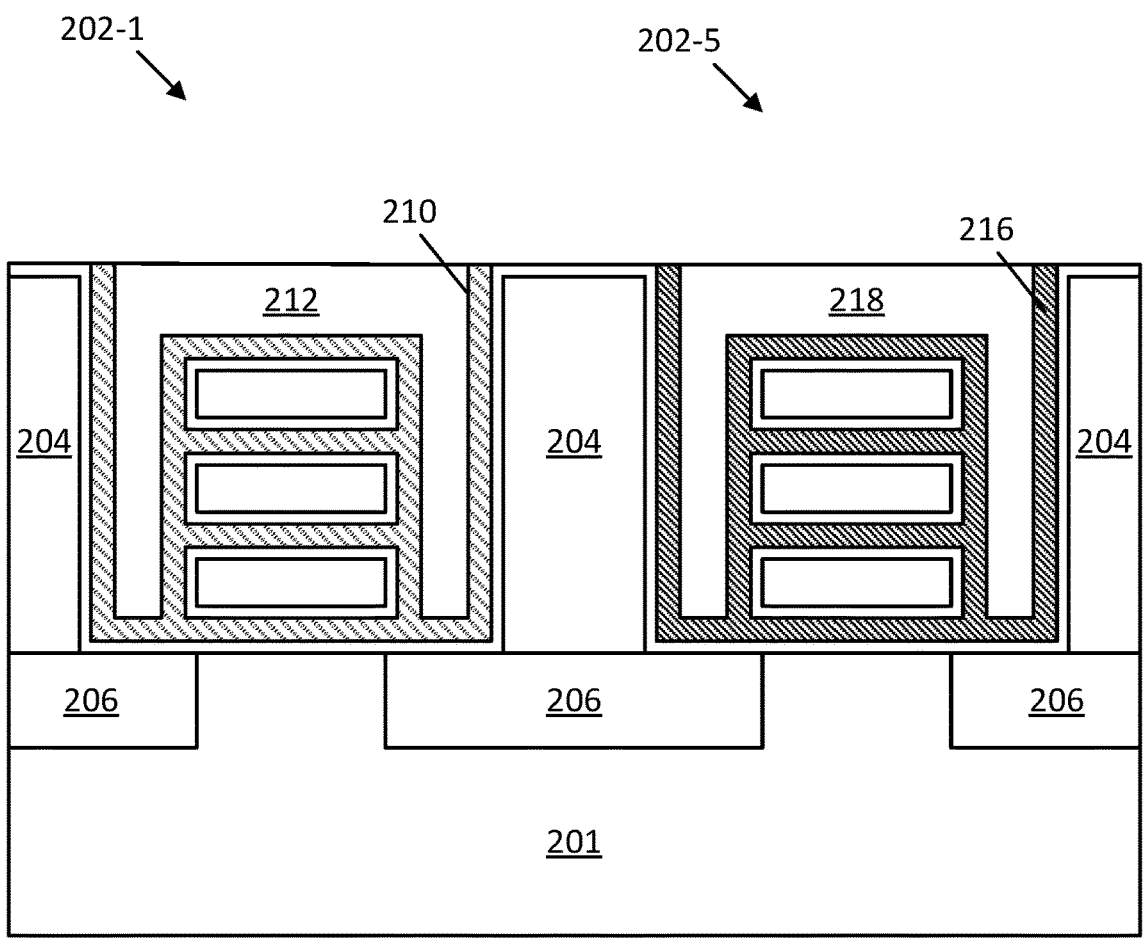

FIG. 2D illustrates top-down and cross-sectional views of the structure depicted in FIG. 2C, after forming a second seed structure 216 on the remaining semiconductor devices that do not already include first seed structure 210, according to an embodiment of the present disclosure. Similar to first seed structure 210, second seed structure 216 may include a stack of conductive layers, such as at least one conductive layer that includes the dopant element to be diffused into the underlying gate dielectric layer 208. In an embodiment, second seed structure 216 includes a layer of lanthanum directly on the gate dielectric layer 208, and a capping layer of titanium nitride (TiN). According to some embodiments, the layer of lanthanum within second seed structure 216 has a thickness of around 4 Å and the capping layer of TiN has a thickness of around 10 Å. Second seed structure 216 may be deposited using any known metal deposition technique, such as CVD, ALD, or PECVD. Note that second seed structure 216 includes a thinner layer of lanthanum compared to first seed structure 210. Accordingly, a higher lanthanum concentration will be diffused into the gate dielectric layer 208 beneath first seed structure 210 as compared to the gate dielectric layer 208 beneath second seed structure 216 during a later annealing operation.

Following deposition of second seed structure 216, another dielectric fill 218 is deposited that is similar to dielectric fill 212 and the structure is once again planarized using, for example, CMP. The planarization isolates second seed structure 216 within each of semiconductor devices 202-2-202-7 while also ensuring that no portions of second seed structure 216 are present over either semiconductor device 202-1 or 202-8, according to an embodiment.

The process described and illustrated between FIGS. 2C and 2D may be repeated any number of times by masking different semiconductor devices and depositing different seed structures over the exposed semiconductor devices. For example, a further masking operation may be performed to mask devices 202-1, 202-2, 202-7, and 202-8 while stripping second seed structure 216 from the exposed devices and depositing a third seed structure over the exposed devices that has a thinner layer of lanthanum (such as around 2 Å in thickness). Another masking operation may then be performed to mask devices 202-1, 202-2, 202-3, 202-6, 202-7, and 202-8 while stripping the third seed layer from the exposed devices. A blanket deposition of TiN may then be performed to cover the exposed devices (e.g., containing no lanthanum). Following any number of such masking, stripping, and depositing operations, different semiconductor devices will have seed structures on them that include lanthanum layers with different thicknesses (e.g., some with a lanthanum layer thickness of 6 Å, 4 Å, or 2 Å). Once all seed structures have been deposited, an anneal operation is performed to drive the lanthanum into the underlying gate dielectric layer 208. The anneal may be performed at a temperature between 800 C and 1250 C for a time anywhere between 10 nanoseconds and 1 second. Once gate dielectric layer 208 has been doped with the lanthanum, all seed structure layers are removed from semiconductor devices 202-1-202-8 using any wet or dry isotropic etching technique.

FIGS. 3A-3G include cross-sectional views that collectively illustrate an example process for forming an integrated circuit configured with semiconductor devices having different gate work function metals, in accordance with an embodiment of the present disclosure. Each figure shows an example structure that results from the process flow up to that point in time, so the depicted structure evolves as the process flow continues, culminating in the structure shown in FIG. 3G, which is similar to the structure shown in FIG. 1C. The illustrated integrated circuit structure may be part of a larger integrated circuit that includes other integrated circuitry not depicted. Example materials and process parameters are given, but the present disclosure is not intended to be limited to any specific such materials or parameters, as will be appreciated.

Figure 3A:
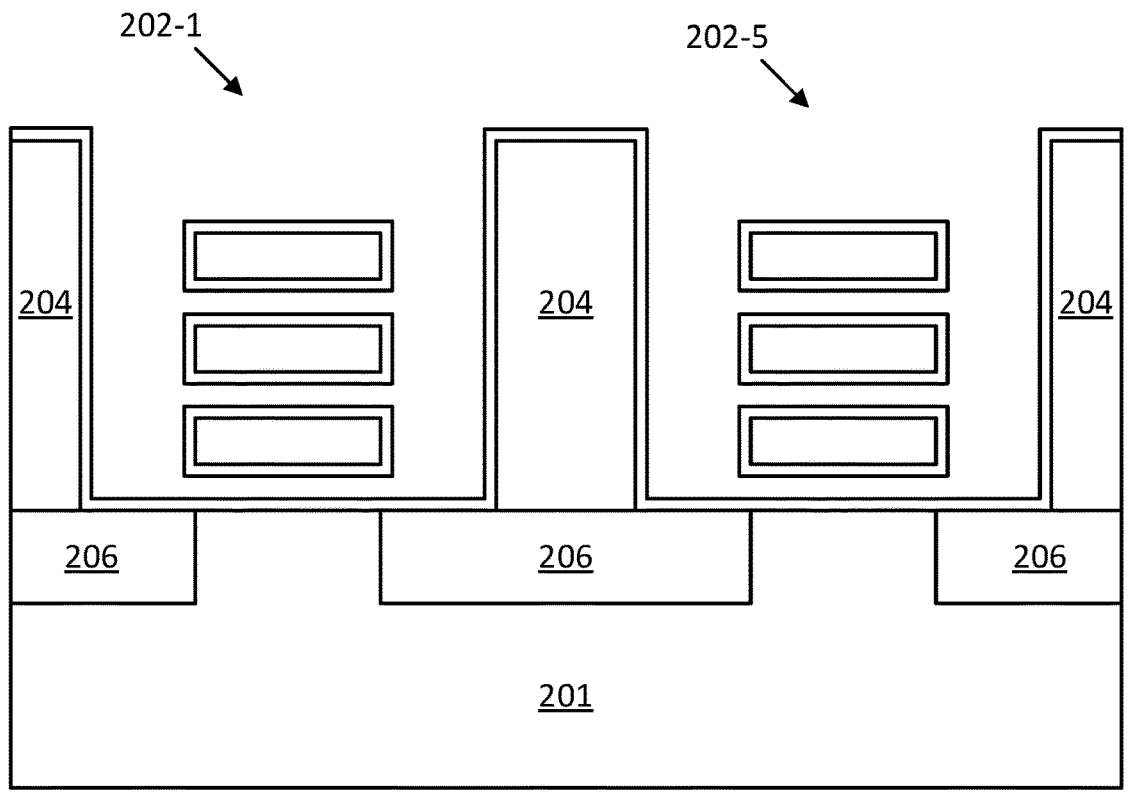
FIGS. 3A-3G are cross-section views that illustrate various stages in an example process for forming different gate materials over different semiconductor devices, in accordance with some embodiments of the present disclosure.

FIG. 3A illustrates a cross-section view taken across two semiconductor devices, such as semiconductor devices 202-1 and 202-5 from FIGS. 2A-2D. In some embodiments, the structure shown in FIG. 3A may be the resulting structure following the removal of all of the seed structure layers used to dope portions of gate dielectric layer 208, as described above with reference to FIG. 2D. Accordingly, many of the same labeled elements are provided again.

Figure 3B:
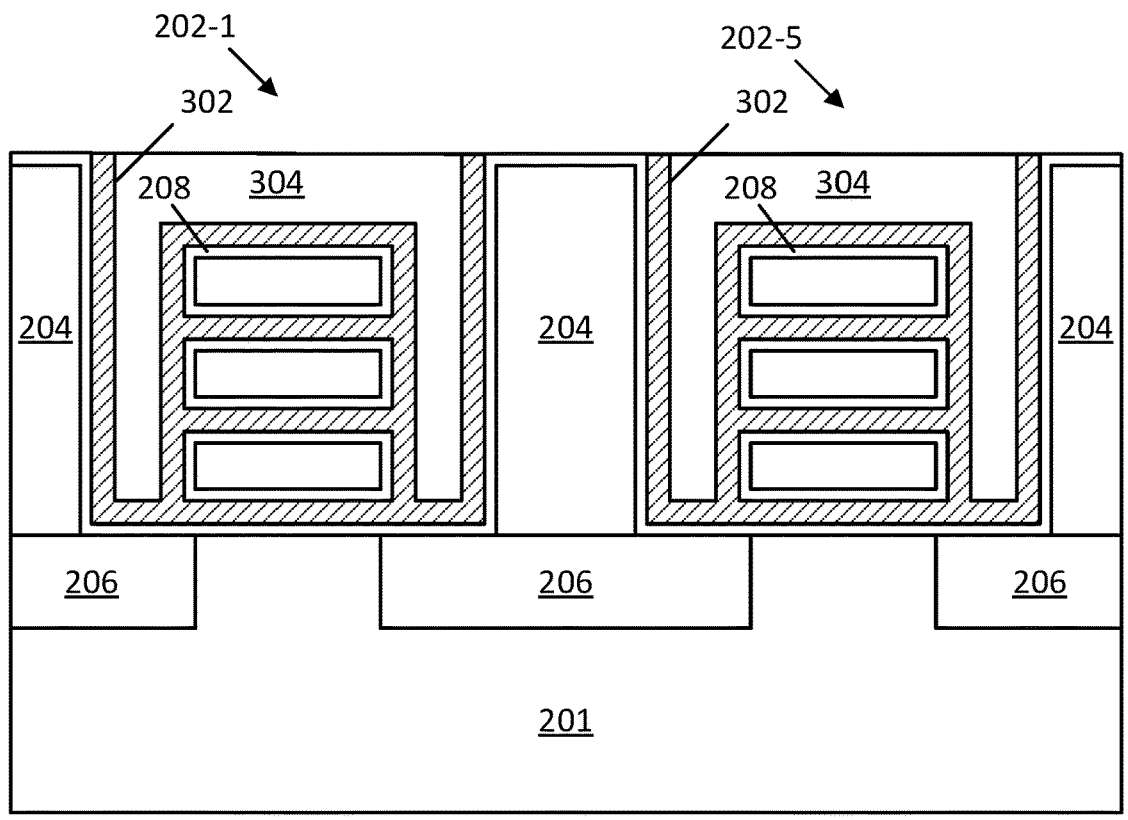

FIG. 3B illustrates a cross-sectional view of the structure depicted in FIG. 3A, after depositing a first conductive material 302, according to an embodiment of the present disclosure. First conductive material 302 may act as a first work function metal to be used as a gate electrode around either semiconductor device 202-1 or 202-5. In some embodiments, semiconductor device 202-1 is an n-channel device and first conductive material 302 is an n-channel work function metal that includes titanium. In one example, first conductive material 302 includes titanium, aluminum, carbon, and oxygen (TiAlCO).

First conductive material 302 may be deposited using any known metal deposition technique, such as CVD, ALD, or PECVD. First conductive material 302 may have a deposited thickness between about 1 nm and about 5 nm. In some embodiments, first conductive material 302 is deposited to a thickness sufficient enough to fill the voids between adjacent nanoribbons of a given semiconductor device. First conductive material 302 is also formed along the sidewalls of any adjacent dielectric walls 204. Following the deposition of first conductive material 302, a dielectric fill 304 may be deposited using any known deposition technique, such as CVD, flowable CVD, spin-on dielectric, PECVD, or ALD. In some embodiments, dielectric fill 304 is silicon oxide although any other dielectric materials may be used as well. Following the deposition of dielectric fill 304, any excess dielectric fill 304 above the top surface of dielectric wall 204 is removed along with the layer of first conductive material 302 over the top surface of dielectric wall 204. Polishing may be performed using one or more rounds of chemical mechanical polishing (CMP) to produce a planarized top surface. In some examples, gate dielectric layer 208 remains along the top surfaces of dielectric wall 204 following the polishing process. In some examples, gate dielectric layer 208 is removed from the top surfaces of dielectric wall 204 by the polishing process.

Figure 3C:
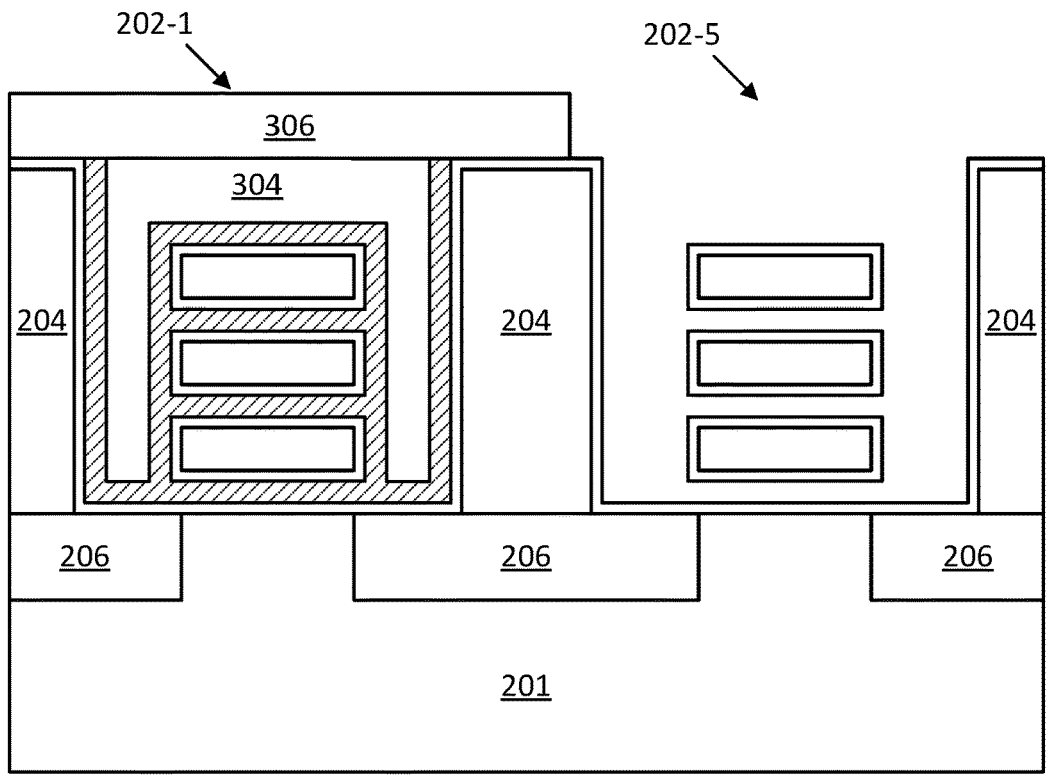

FIG. 3C illustrates a cross-sectional view of the structure depicted in FIG. 3B, after masking some of the devices and removing first conductive material 302 from the unmasked devices, according to an embodiment of the present disclosure. A mask layer 306 may be deposited and patterned using known lithography techniques to protect one or more of the semiconductor devices, such as semiconductor device 202-1. In the illustrated example, the other semiconductor device 202-5 is left exposed. Mask layer 306 may be any type of photoresist or a hard mask material, such as a carbon hard mask (CHM). In some embodiments, mask layer 306 is patterned to protect all n-channel devices (having first conductive material 302) while exposing all p-channel devices (to have a second conductive material).

According to some embodiments, both dielectric fill 304 and first conductive material 302 are stripped away from semiconductor device 202-5. An isotropic wet or dry etch may be used to remove all exposed portions of both dielectric fill 304 and first conductive material 302, including any first conductive material 302 between the nanoribbons 112. Once the exposed portions of first conductive material 302 have been removed, mask layer 306 may be removed using an ash process or a wet etching process.

Due to the presence of dielectric wall 204 to provide isolation between adjacent semiconductor structures, a long removal process can be performed within semiconductor device 202-5 to remove all or nearly all portions of first conductive material 302 while maintaining first conductive material 302 in semiconductor device 202-1. At this stage, a second conductive material suited to be a different work function metal than first conductive material 302 may be deposited over semiconductor device 202-5. Performing another dielectric fill and polishing yields a structure similar to that shown in FIG. 1A where two different work function metals are provided over adjacent semiconductor devices. However, the fabrication process can also include the removal of the dielectric wall 204 between the semiconductor devices to link their gates together, and this process is described in the remaining FIGS. 3D-3G.

Figure 3D:
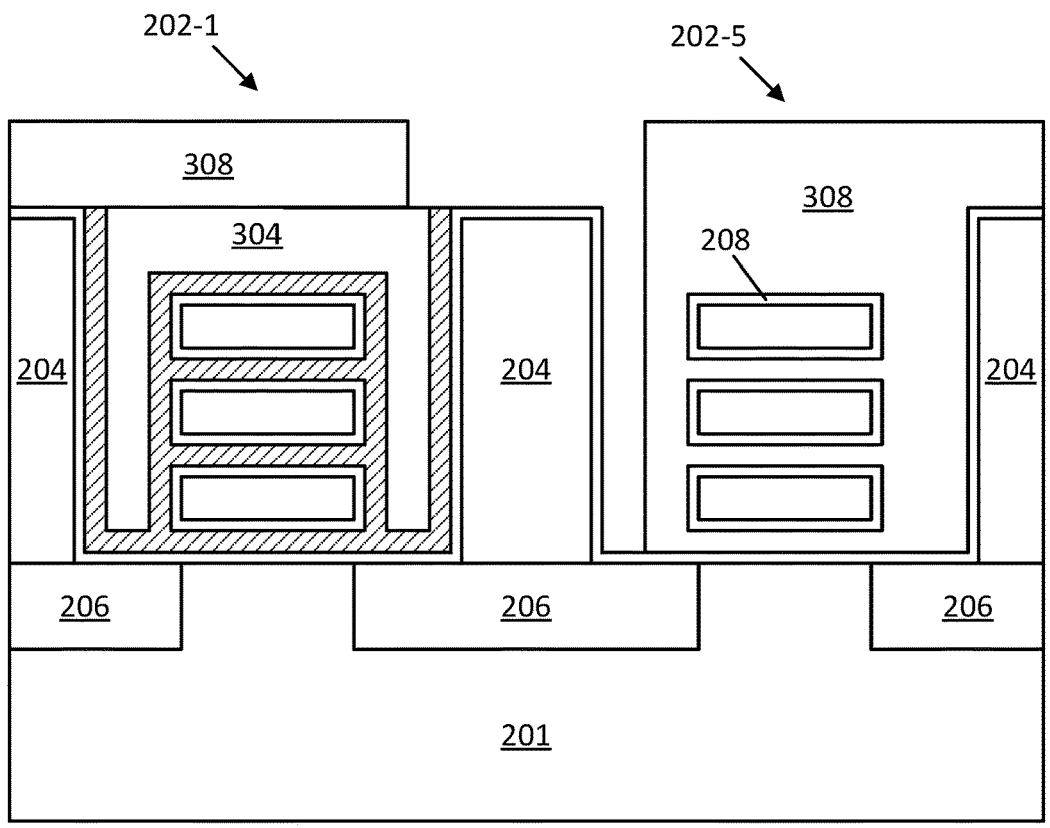

FIG. 3D illustrates a cross-sectional view of the structure depicted in FIG. 3C, after forming a new mask layer 308, according to an embodiment of the present disclosure. Mask layer 308 may be similar to mask layer 306, and thus may be formed using standard lithography techniques. According to some embodiments, mask layer 308 protects both the semiconductor structures of semiconductor device 202-5 as well as semiconductor device 202-1. However, mask layer 306 is patterned to expose the dielectric wall 204 between semiconductor device 202-1 and semiconductor device 202-5, according to some embodiments. Furthermore, the opening in mask layer 306 does not need to be centered over dielectric wall 204. Rather, the opening may be shifted closer to first semiconductor device 202-1 (and away from the nanoribbons of second semiconductor device 202-5) to ensure that the gate dielectric layer 208 around the nanoribbons of second semiconductor device 202-5 are protected by mask layer 308.

Figure 3E:
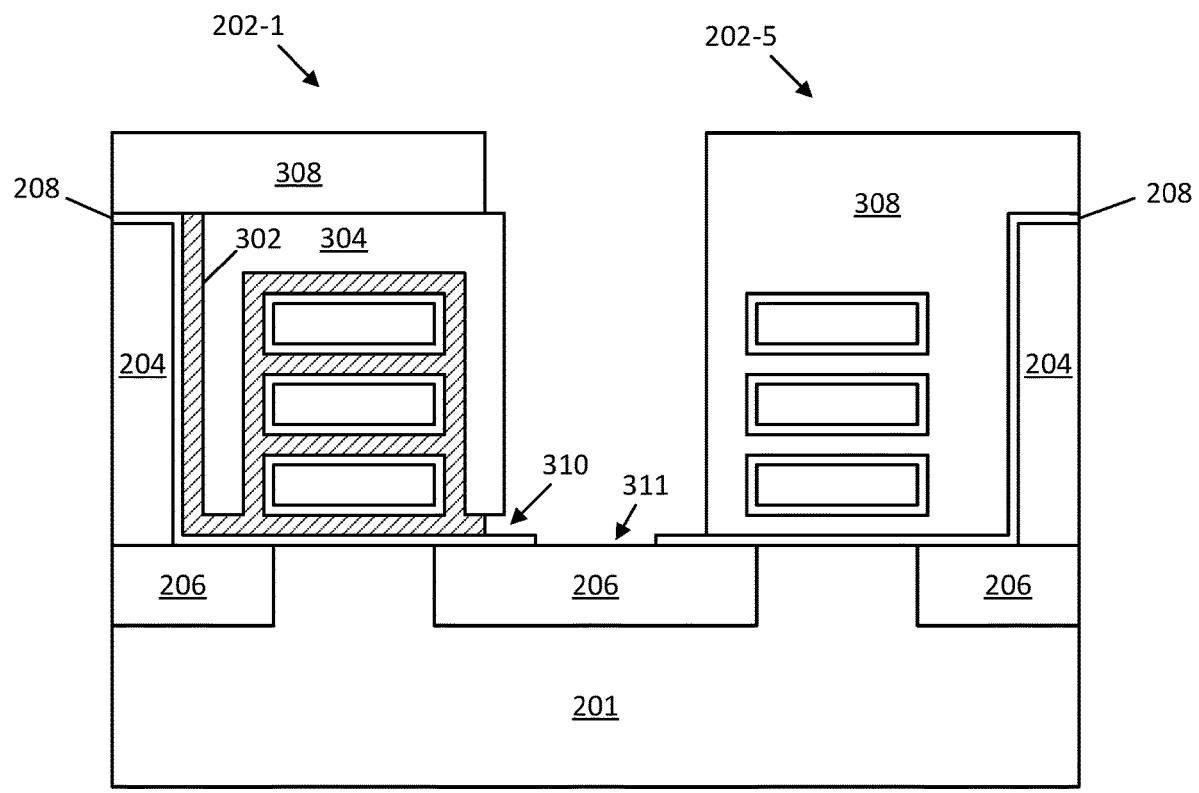

FIG. 3E illustrates a cross-sectional view of the structure depicted in FIG. 3D, after removing the dielectric wall 204 between the adjacent semiconductor devices, according to an embodiment of the present disclosure. Various etches may be performed in stages to remove different material layers, according to some embodiments. For example, a first isotropic etch may be performed to punch through the gate dielectric layer 208 (if present) to expose the dielectric material of dielectric wall 204. Next, an isotropic wet or dry etch may be performed to remove dielectric wall 204. This may be followed by an additional isotropic wet or dry etch to remove the exposed portion of first conductive material 302 that had been running up the sidewall of dielectric wall 204. Any number of etches may be performed in any order to remove the various layers on dielectric wall 204 and to remove dielectric wall 204 itself from between semiconductor device 202-1 and semiconductor device 202-5. During the isotropic etching process used to remove the exposed portion of first conductive material 302, some of first conductive material 302 may be etched from beneath dielectric fill 304 to form recess 310. Once all etches have been performed to remove dielectric wall 204 and any exposed portions of first conductive material 302, mask layer 308 can be removed using any ash process or wet etch process.

According to some embodiments, the removal of dielectric wall 204 forms a discontinuity 311 in gate dielectric layer 208. The length of discontinuity 311 between the opposing ends of gate dielectric layer 208 may vary depending on the etch rate and etch procedure used to remove the various material layers as discussed above.

Figure 3F:
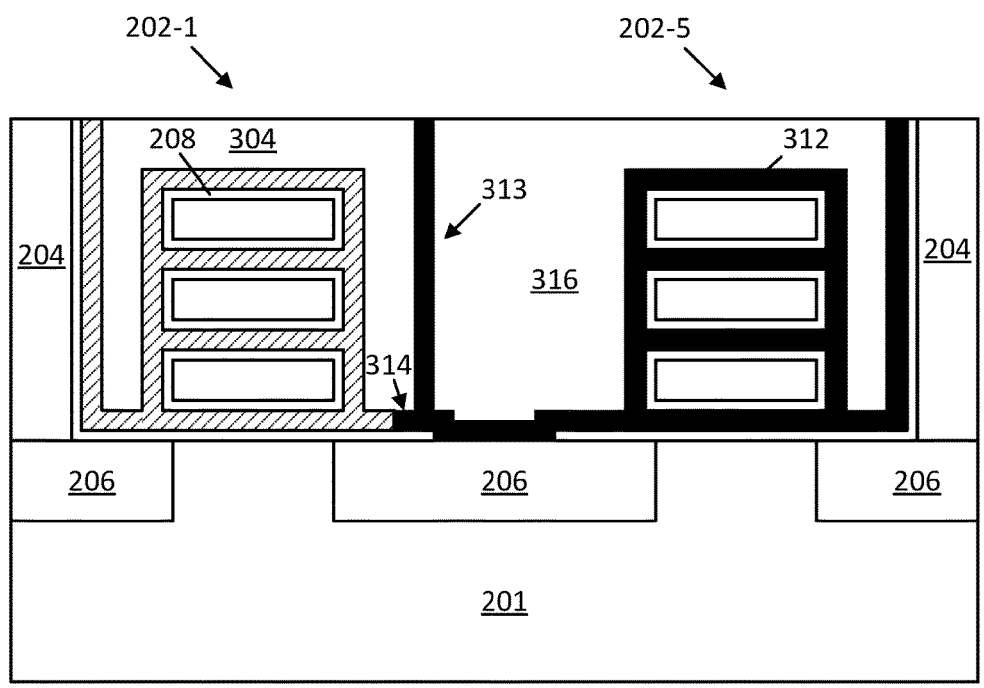

FIG. 3F illustrates a cross-sectional view of the structure depicted in FIG. 3E, after depositing a second conductive material 312 over second semiconductor device 202-5, according to an embodiment of the present disclosure. Second conductive material 312 may act as a second work function metal to be used as a gate electrode around semiconductor device 202-5. In some embodiments, semiconductor device 202-5 is a p-channel device and second conductive material 312 is a p-channel work function metal that includes tungsten.

Second conductive material 312 may be deposited using any known metal deposition technique, such as CVD, ALD, or PECVD. Second conductive material 312 may have a deposited thickness between about 1 nm and about 5 nm. In some embodiments, second conductive material 312 is deposited to a thickness sufficient enough to fill the voids between adjacent nanoribbons of semiconductor device 202-5. Second conductive material 312 is also formed along the sidewall of adjacent dielectric wall 204. Following the deposition of second conductive material 312, another dielectric fill 316 may be deposited using any known deposition technique, such as CVD, flowable CVD, spin-on dielectric, PECVD, or ALD. Dielectric fill 316 may be similar to dielectric fill 304. Accordingly, in some embodiments, dielectric fill 316 is silicon oxide although any other dielectric materials may be used as well. Following the deposition of dielectric fill 316, any excess dielectric fill 316 above the top surface of dielectric wall 204 is removed along with the layer of second conductive material 312 over the top surface of dielectric wall 204. Polishing may be performed using one or more rounds of CMP to produce a planarized top surface.

The formation of second conductive material 312 produces some distinguishing features due to the presence of dielectric fill 304 protecting first semiconductor device 202-1. For example, a portion of second conductive material 312 may be present along a sidewall of dielectric fill 304 which yields a conductive wall 313 of the second conductive material 312 between semiconductor devices 202-1 and 202-5. According to some embodiments, conductive wall 313 may be closer to one semiconductor device than the other semiconductor device (such as the illustrated example where conductive wall 313 is closer to semiconductor device 202-1). In some embodiments, gate dielectric layer 208 is not on any vertical portion of conductive wall 313. In other words, no part of gate dielectric layer 208 from either semiconductor device 202-1 or semiconductor device 202-5 extends up the sidewalls of conductive wall 313. In another example, second conductive material 312 may form a protruding structure 314 beneath dielectric fill 304 due to second conductive material 312 being formed within recess 310. Accordingly, a portion of second conductive material 312 may contact a portion of first conductive material 302 via the protruding structure 314. Protruding structure 314 may extend any distance beneath dielectric fill 304 based on the etch rate of first conductive material 302 and etch time used during its removal as discussed above with reference to FIG. 3E. In another example, second conductive material 312 may be formed within discontinuity 311 such that second conductive material 312 contacts a portion of dielectric fill 206.

Figure 3G:
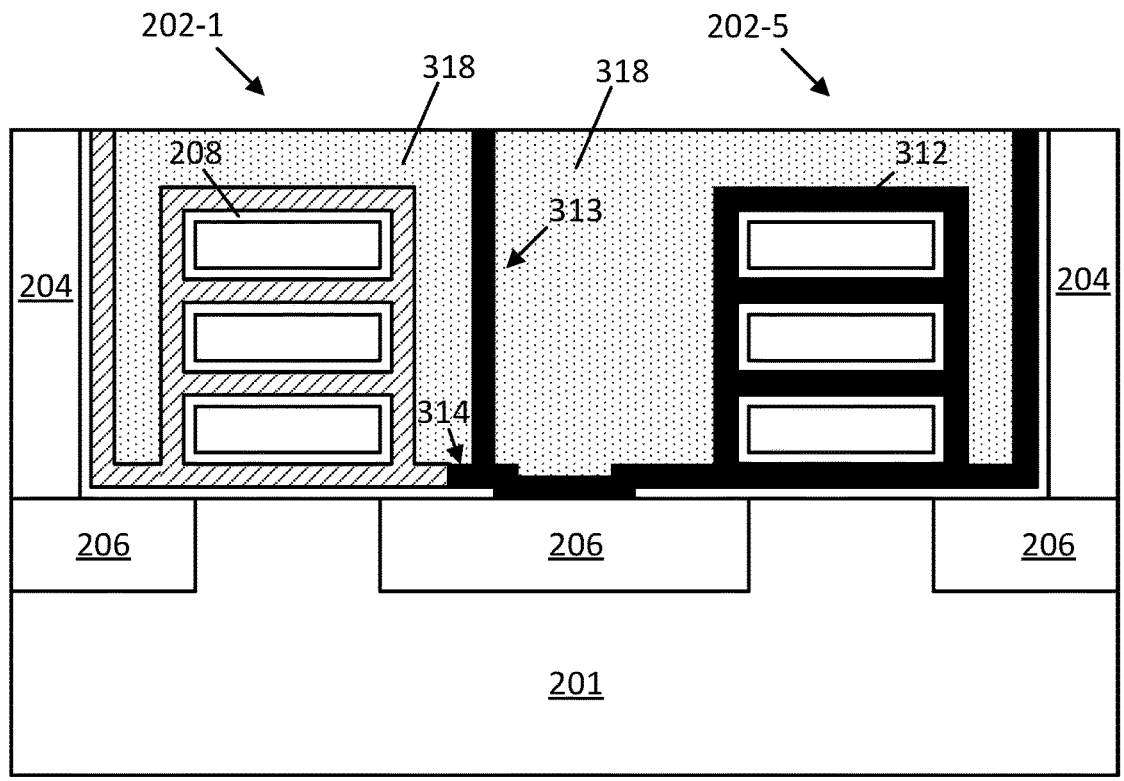

FIG. 3G illustrates a cross-sectional view of the structure depicted in FIG. 3F, after forming a fill metal 318, according to an embodiment of the present disclosure. Both dielectric fill 304 and dielectric fill 316 can be removed from both semiconductor devices 202-1 and 202-5 using any wet or dry etching technique. Afterwards, fill metal 318 may be formed in the space that had been occupied by the fill dielectrics between both semiconductor devices 202-1 and 202-5. Accordingly, fill metal 318 contacts both first conductive material 302 and second conductive material 312. Fill metal 318 may include tungsten (W) or a combination of titanium nitride (TiN) and tungsten (W), to name a few examples, and may be deposited using any known metal deposition technique, such as CVD, ALD, or PECVD. In some embodiments, fill metal 318 is formed via an electroplating or electroless plating process. Excess portions of fill metal 318 may be polished away using CMP to planarize the top surface of both semiconductor devices 202-1 and 202-5. According to some embodiments, fill metal 318 contacts both sides of conductive wall 313.

Figure 4:
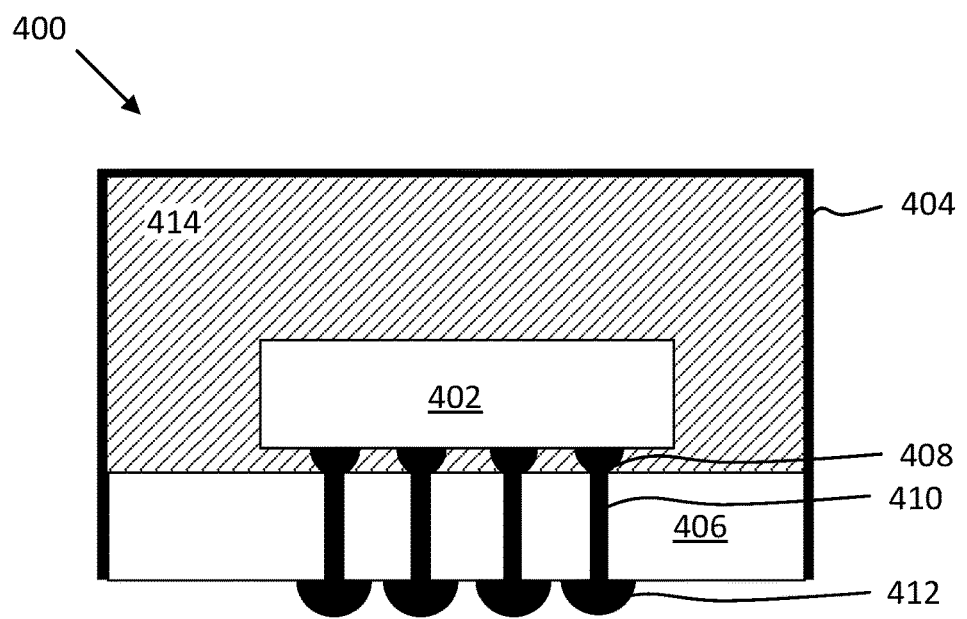
FIG. 4 illustrates a cross-section view of a chip package containing one or more semiconductor dies, in accordance with some embodiments of the present disclosure.

FIG. 4 illustrates an example embodiment of a chip package 400, in accordance with an embodiment of the present disclosure. As can be seen, chip package 400 includes one or more dies 402. One or more dies 402 may include at least one integrated circuit having semiconductor devices, such as any of the semiconductor devices disclosed herein. One or more dies 402 may include any other circuitry used to interface with other devices formed on the dies, or other devices connected to chip package 400, in some example configurations.

As can be further seen, chip package 400 includes a housing 404 that is bonded to a package substrate 406. The housing 404 may be any standard or proprietary housing, and may provide, for example, electromagnetic shielding and environmental protection for the components of chip package 400. The one or more dies 402 may be conductively coupled to a package substrate 406 using connections 408, which may be implemented with any number of standard or proprietary connection mechanisms, such as solder bumps, ball grid array (BGA), pins, or wire bonds, to name a few examples. Package substrate 406 may be any standard or proprietary package substrate, but in some cases includes a dielectric material having conductive pathways (e.g., including conductive vias and lines) extending through the dielectric material between the faces of package substrate 406, or between different locations on each face. In some embodiments, package substrate 406 may have a thickness less than 1 millimeter (e.g., between 0.1 millimeters and 0.5 millimeters), although any number of package geometries can be used. Additional conductive contacts 412 may be disposed at an opposite face of package substrate 406 for conductively contacting, for instance, a printed circuit board (PCB). One or more vias 410 extend through a thickness of package substrate 406 to provide conductive pathways between one or more of connections 408 to one or more of contacts 412. Vias 410 are illustrated as single straight columns through package substrate 406 for ease of illustration, although other configurations can be used (e.g., damascene, dual damascene, through-silicon via, or an interconnect structure that meanders through the thickness of substrate 406 to contact one or more intermediate locations therein). In still other embodiments, vias 410 are fabricated by multiple smaller stacked vias, or are staggered at different locations across package substrate 406. In the illustrated embodiment, contacts 412 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 412, to inhibit shorting.

In some embodiments, a mold material 414 may be disposed around the one or more dies 402 included within housing 404 (e.g., between dies 402 and package substrate 406 as an underfill material, as well as between dies 402 and housing 404 as an overfill material). Although the dimensions and qualities of the mold material 414 can vary from one embodiment to the next, in some embodiments, a thickness of mold material 414 is less than 1 millimeter. Example materials that may be used for mold material 414 include epoxy mold materials, as suitable. In some cases, the mold material 414 is thermally conductive, in addition to being electrically insulating.

Methodology

Figure 5:
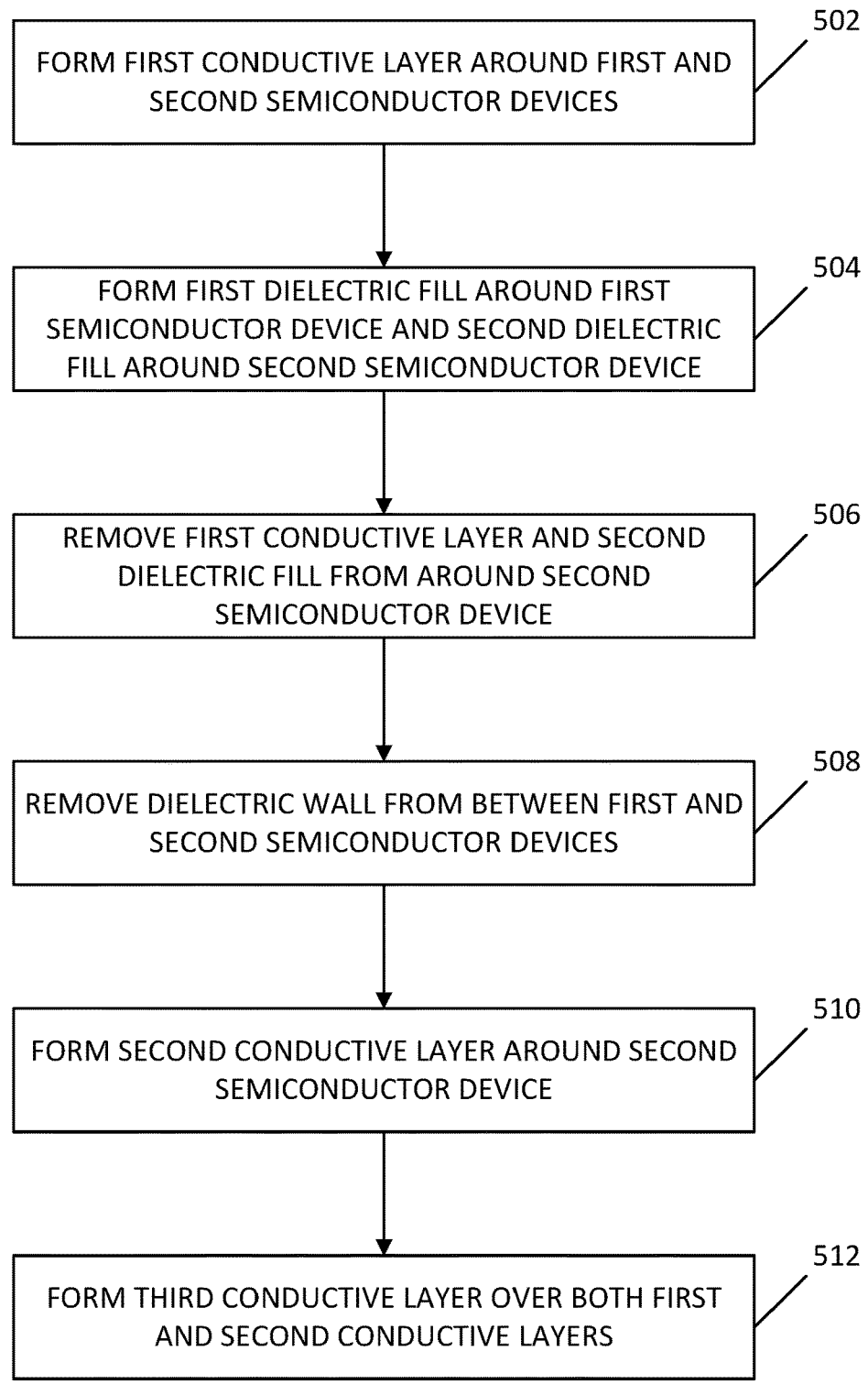
FIG. 5 is a flowchart of a fabrication process for semiconductor devices having different gate materials, in accordance with an embodiment of the present disclosure.

FIG. 5 is a flow chart of a method 500 for forming at least a portion of an integrated circuit, according to an embodiment. Various operations of method 500 may be illustrated in FIGS. 3A-3G. However, the correlation of the various operations of method 500 to the specific components illustrated in the aforementioned figures is not intended to imply any structural and/or use limitations. Rather, the aforementioned figures provide one example embodiment of method 500. Other operations may be performed before, during, or after any of the operations of method 500. For example, method 500 does not explicitly describe many steps that are performed to form common transistor structures. Some of the operations of method 500 may be performed in a different order than the illustrated order.

Method 500 begins with operation 502 where at a first conductive layer is formed over first and second semiconductor devices. The first and second semiconductor devices may be nanoribbon transistors such that the first conductive layer is formed around the nanoribbons of each of the first and second semiconductor devices. In some embodiments, the first semiconductor device is an n-channel device while the second semiconductor device is a p-channel device and the first conductive layer is an n-channel work function metal that includes titanium. In one example, the first conductive layer includes titanium, aluminum, carbon, and oxygen (TiAlCO).

The first conductive layer may be deposited using any known metal deposition technique, such as CVD, ALD, or PECVD. The first conductive layer may have a deposited thickness between about 1 nm and about 5 nm. In some embodiments, the first conductive layer is deposited to a thickness sufficient enough to fill the voids between adjacent nanoribbons of a given semiconductor device.

Method 500 continues with operation 504 where dielectric fill structures are formed over both the first and second semiconductor devices. The dielectric fill structures over each of the semiconductor devices may be the same material, such as silicon oxide, or any other dielectric material. The dielectric fill structures may be deposited using any known deposition technique, such as CVD, flowable CVD, spin-on dielectric, PECVD, or ALD. Excess portions of the dielectric fill may be removed along with a portion of the first conductive layer along a top of the integrated circuit. Polishing may be performed using one or more rounds of CMP to produce the planarized top surface.

Method 500 continues with operation 506 where the first conductive layer and dielectric fill are removed from around the second semiconductor device (and maintained around the first semiconductor device). A mask layer may be used to protect the first semiconductor device while one or more etching operations are performed to remove both the dielectric fill and first conductive layer from around the second semiconductor device. An isotropic wet or dry etch may be used to remove all exposed portions of the first conductive layer, including between the nanoribbons of the second semiconductor device. Once all or nearly all of the first conductive layer has been removed from around the second semiconductor device, the mask layer may be removed using an ash process or a wet etching process.

Method 500 continues with operation 508 where a dielectric wall is removed from between the first and second semiconductor devices. According to some embodiments, each of the semiconductor devices includes two or more dielectric walls that isolate the devices from neighboring semiconductor devices. The dielectric material of the dielectric wall may be silicon nitride, although any dielectric material can be used that has a sufficiently high etch selectively to silicon oxide. A new mask layer may be formed to protect the first and second semiconductor devices while exposing the dielectric wall between them. The new mask layer may be similar to the mask layer used during operation 506.

Various etches may be performed in stages to remove different material layers on the dielectric wall and to remove the dielectric wall itself, according to some embodiments. For example, a first isotropic etch may be performed to punch through a gate dielectric (if present) to expose the dielectric material of the dielectric wall. Next, an isotropic wet or dry etch may be performed to remove the dielectric wall. This may be followed by an additional isotropic wet or dry etch to remove the exposed portion of the first conductive layer that had been running up the sidewall of the dielectric wall. Any number of etches may be performed in any order to remove the various material layers on the dielectric wall and to remove the dielectric wall itself from between the first and second semiconductor devices. During the isotropic etching process used to remove the exposed portion of the first conductive layer, some of the first conductive layer may be etched away from beneath the dielectric fill over the first semiconductor device. Once all etches have been performed to remove the dielectric wall and any exposed portions of the first conductive layer, the new mask layer can be removed using any ash process or wet etch process.

Method 500 continues with operation 510 where a second conductive layer is formed around the second semiconductor device. In some embodiments, the second semiconductor device is a p-channel device and the second conductive layer is a p-channel work function metal that includes tungsten.

The second conductive layer may be deposited using any known metal deposition technique, such as CVD, ALD, or PECVD. The second conductive layer may have a deposited thickness between about 1 nm and about 5 nm. In some embodiments, the second conductive layer is deposited to a thickness sufficient enough to fill the voids between adjacent nanoribbons of the second semiconductor device. Following the deposition of the second conductive layer, another dielectric fill may be deposited over the second semiconductor device using any known deposition technique, such as CVD, flowable CVD, spin-on dielectric, PECVD, or ALD. A polishing procedure using one or more rounds of CMP may be performed to planarize the top surface of the structure.

Method 500 continues with operation 512 where a third conductive layer is formed over both the first and second conductive layers. The dielectric fill structures over both the first and second semiconductor devices are first removed such that the third conductive layer substantially fills the space over both the first and second semiconductor devices that had previously been occupied by the dielectric fill structures. The third conductive layer may act as a fill metal that includes tungsten, TiN, or any combination thereof. The third conductive layer may be deposited using electroplating, electroless plating, CVD, or PECVD, to name a few examples.

Example System

Figure 6:
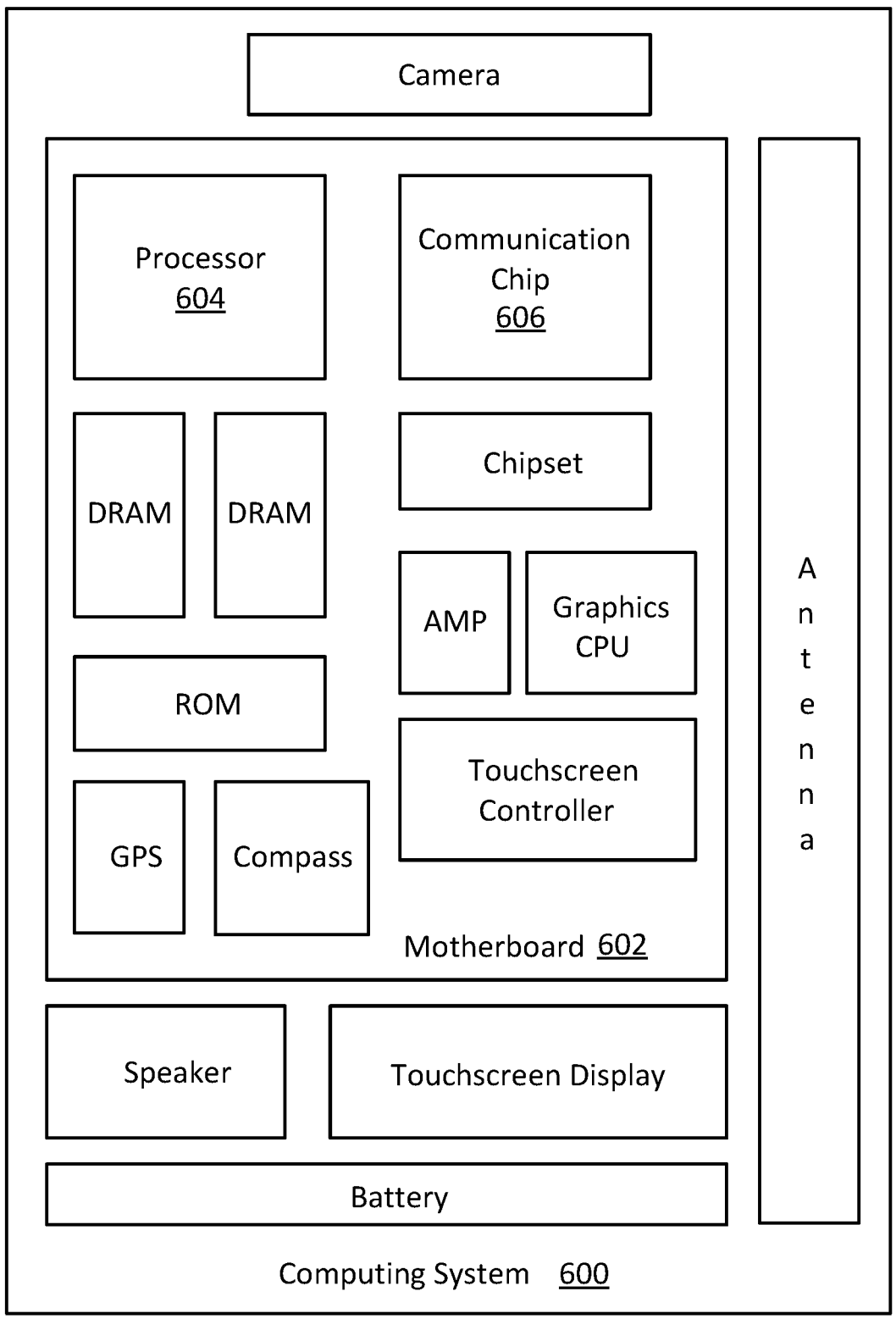
FIG. 6 illustrates a computing system including one or more integrated circuits, as variously described herein, in accordance with an embodiment of the present disclosure.

FIG. 6 is an example computing system implemented with one or more of the integrated circuit structures as disclosed herein, in accordance with some embodiments of the present disclosure. As can be seen, the computing system 600 houses a motherboard 602. The motherboard 602 may include a number of components, including, but not limited to, a processor 604 and at least one communication chip 606, each of which can be physically and electrically coupled to the motherboard 602, or otherwise integrated therein. As will be appreciated, the motherboard 602 may be, for example, any printed circuit board (PCB), whether a main board, a daughterboard mounted on a main board, or the only board of system 600, etc.

Depending on its applications, computing system 600 may include one or more other components that may or may not be physically and electrically coupled to the motherboard 602. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 600 may include one or more integrated circuit structures or devices configured in accordance with an example embodiment (e.g., a module including an integrated circuit device on a substrate, the substrate having semiconductor devices with different gate work function metals, as variously provided herein). In some embodiments, multiple functions can be integrated into one or more chips (e.g., for instance, note that the communication chip 606 can be part of or otherwise integrated into the processor 604).

The communication chip 606 enables wireless communications for the transfer of data to and from the computing system 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing system 600 includes an integrated circuit die packaged within the processor 604. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 606 also may include an integrated circuit die packaged within the communication chip 606. In accordance with some such example embodiments, the integrated circuit die of the communication chip includes one or more semiconductor devices as variously described herein. As will be appreciated in light of this disclosure, note that multi-standard wireless capability may be integrated directly into the processor 604 (e.g., where functionality of any chips 606 is integrated into processor 604, rather than having separate communication chips). Further note that processor 604 may be a chip set having such wireless capability. In short, any number of processor 604 and/or communication chips 606 can be used. Likewise, any one chip or chip set can have multiple functions integrated therein.

In various implementations, the computing system 600 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 600 may be combined or integrated in a system-on-a-chip (SoC) architecture. In some embodiments, the components may be hardware components, firmware components, software components or any suitable combination of hardware, firmware or software.

FURTHER EXAMPLE EMBODIMENTS

The following examples pertain to further embodiments, from which numerous permutations and configurations will be apparent.

Example 1 is an integrated circuit that includes a first semiconductor device having a first plurality of semiconductor nanoribbons extending in a direction and between a first source region and a first drain region, a second semiconductor device having a second plurality of semiconductor nanoribbons extending in the direction and between a second source region and a second drain region, a first conductive material surrounding at least a portion of the first plurality of semiconductor nanoribbons, a second conductive material different from the first conductive material and surrounding at least a portion of the second plurality of semiconductor nanoribbons, and a third conductive material on both the first and second conductive materials. The first conductive material is between adjacent nanoribbons of the first plurality of semiconductor nanoribbons and the second conductive material is between adjacent nanoribbons of the second plurality of semiconductor nanoribbons.

Example 2 includes the subject matter of Example 1, wherein the first conductive material runs along a sidewall of a first dielectric wall adjacent to the first semiconductor device, and the second conductive material runs along a sidewall of a second dielectric wall adjacent to the second semiconductor device.

Example 3 includes the subject matter of Example 1 or 2, wherein the second conductive material forms a wall between the first semiconductor device and the second semiconductor device such that the third conductive material contacts both sides of the wall.

Example 4 includes the subject matter of Example 3, wherein the second conductive material includes a protruding structure adjacent to the wall, the protruding structure extending from the wall and contacting the first conductive material.

Example 5 includes the subject matter of Example 3 or 4, further comprising a first gate dielectric layer around the first plurality of semiconductor nanoribbons and a second gate dielectric layer around the second plurality of semiconductor nanoribbons, wherein no part of the first gate dielectric layer or the second gate dielectric layer extends up the sidewalls of the wall.

Example 6 includes the subject matter of Example 5, further comprising a first dielectric wall adjacent to the first semiconductor device and a second dielectric wall adjacent to the second semiconductor device, wherein the first gate dielectric layer extends up a sidewall of the first dielectric wall and the second gate dielectric layer extends up a sidewall of the second dielectric wall.

Example 7 includes the subject matter of any one of Examples 1-6, further comprising a first high-K dielectric layer around the first plurality of semiconductor nanoribbons and a second high-K dielectric layer around the second plurality of semiconductor nanoribbons.

Example 8 includes the subject matter of Example 7, further comprising a dielectric layer between the first semiconductor device and the second semiconductor device, wherein the second conductive material is present within a discontinuity between the first high-K dielectric layer and the second high-K dielectric layer such that the second conductive material contacts at least a portion of the dielectric layer between the first semiconductor device and the second semiconductor device.

Example 9 includes the subject matter of Example 7 or 8, wherein the first high-K dielectric layer comprises a first concentration of lanthanum and the second high-K dielectric layer comprises a second concentration of lanthanum different from the first concentration of lanthanum.

Example 10 includes the subject matter of any one of Examples 1-9, wherein the first conductive material comprises titanium and the second conductive material comprises tungsten.

Example 11 includes the subject matter of Example 10, wherein the first semiconductor device is an n-channel device, and the second semiconductor device is a p-channel device.

Example 12 includes the subject matter of any one of Examples 1-11, wherein the first plurality of semiconductor nanoribbons and the second plurality of semiconductor nanoribbons comprise germanium, silicon, or germanium and silicon.

Example 13 includes the subject matter of any one of Examples 1-12, wherein the third conductive material comprises one or both of tungsten or titanium.

Example 14 includes the subject matter of any one of Examples 1-13, wherein the first conductive material provides a first layer, and the second conductive material provides a second layer, wherein the first and second layers do not have any overlap.

Example 15 is a printed circuit board comprising the integrated circuit of any one of Examples 1-14.

Example 16 is an electronic device that includes a chip package comprising one or more dies. At least one of the one of the one or more dies includes a first semiconductor device having a first plurality of semiconductor nanoribbons extending in a direction and between a first source region and a first drain region, a second semiconductor device having a second plurality of semiconductor nanoribbons extending in the direction and between a second source region and a second drain region, a first conductive material surrounding at least a portion of the first plurality of semiconductor nanoribbons, a second conductive material different from the first conductive material and surrounding at least a portion of the second plurality of semiconductor nanoribbons, and a third conductive material on both the first and second conductive materials. The first conductive material is between adjacent nanoribbons of the first plurality of semiconductor nanoribbons and the second conductive material is between adjacent nanoribbons of the second plurality of semiconductor nanoribbons.

Example 17 includes the subject matter of Example 16, wherein the first conductive material runs along a sidewall of a first dielectric wall adjacent to the first semiconductor device, and the second conductive material runs along a sidewall of a second dielectric wall adjacent to the second semiconductor device.

Example 18 includes the subject matter of Example 16 or 17, wherein the second conductive material forms a wall between the first semiconductor device and the second semiconductor device such that the third conductive material contacts both sides of the wall.

Example 19 includes the subject matter of Example 18, wherein the second conductive material includes a protruding structure adjacent to the wall, the protruding structure extending from the wall and contacting the first conductive material.

Example 20 includes the subject matter of any one of Examples 16-19, wherein the at least one of the one or more dies further comprises a first high-K dielectric layer around the first plurality of semiconductor nanoribbons and a second high-K dielectric layer around the second plurality of semiconductor nanoribbons.

Example 21 includes the subject matter of Example 20, wherein the first high-K dielectric layer comprises a first concentration of lanthanum and the second high-K dielectric layer comprises a second concentration of lanthanum different from the first concentration of lanthanum.

Example 22 includes the subject matter of any one of Examples 16-21, wherein the first conductive material comprises titanium and the second conductive material comprises tungsten.

Example 23 includes the subject matter of Example 22, wherein the first semiconductor device is an n-channel device, and the second semiconductor device is a p-channel device.

Example 24 includes the subject matter of any one of Examples 16-23, wherein the first plurality of semiconductor nanoribbons and the second plurality of semiconductor nanoribbons comprise germanium, silicon, or germanium and silicon.

Example 25 includes the subject matter of any one of Examples 16-24, wherein the third conductive material comprises one or both of tungsten or titanium.

Example 26 includes the subject matter of any one of Examples 16-25, further comprising a printed circuit board, wherein the chip package is attached to the printed circuit board.

Example 27 is a method of forming an integrated circuit. The method includes forming a first conductive layer around a first plurality of semiconductor nanoribbons of a first semiconductor device and around a second plurality of semiconductor nanoribbons of a second semiconductor device, the first semiconductor device being separated from the second semiconductor device by a dielectric wall; removing the first conductive layer from around the second plurality of semiconductor nanoribbons; removing the dielectric wall from between the first and second semiconductor devices; forming a second conductive layer around the second plurality of semiconductor nanoribbons, the second conductive layer having a different conductive material than the first conductive layer around the first plurality of semiconductor nanoribbons; and forming a third conductive layer over both the first conductive layer and the second conductive layer.

Example 28 includes the subject matter of Example 27, further comprising forming a dielectric fill over the first conductive layer around the first plurality of semiconductor nanoribbons, wherein forming the second conductive layer further comprises forming the second conductive layer along a sidewall of the dielectric fill.

Example 29 includes the subject matter of Example 27 or 28, further comprising forming a high-K dielectric layer over the first plurality of semiconductor nanoribbons and over the second plurality of semiconductor nanoribbons; forming a first layer of lanthanum over the high-K dielectric layer over the first plurality of semiconductor nanoribbons and forming a second layer of lanthanum over the high-K dielectric layer over the second plurality of semiconductor nanoribbons, the second layer of lanthanum having a different thickness than the first layer of lanthanum; and annealing the first and second layers of lanthanum to drive different lanthanum concentrations into the high-K dielectric layer over the first plurality of semiconductor nanoribbons and the high-K dielectric layer over the second plurality of semiconductor nanoribbons.

Example 30 includes the subject matter of any one of Examples 27-29, wherein the first conductive layer comprises titanium and the second conductive layer comprises tungsten.

Example 31 includes the subject matter of any one of Examples 27-30, wherein the third conductive layer comprises one or both of tungsten or titanium.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit comprising:
   a first semiconductor device having a first plurality of semiconductor nanoribbons extending in a direction and between a first source region and a first drain region;
   a second semiconductor device having a second plurality of semiconductor nanoribbons extending in the direction and between a second source region and a second drain region;
   a first conductive material surrounding at least a portion of the first plurality of semiconductor nanoribbons such that the first conductive material is between adjacent nanoribbons of the first plurality of semiconductor nanoribbons;
   a second conductive material different from the first conductive material, the second conductive material surrounding at least a portion of the second plurality of semiconductor nanoribbons such that the second conductive material is between adjacent nanoribbons of the second plurality of semiconductor nanoribbons; and
   a third conductive material directly contacting both the first and second conductive materials, wherein no part of the third conductive material is between the adjacent nanoribbons of the first plurality of semiconductor nanoribbons and no part of the third conductive material is between the adjacent nanoribbons of the second plurality of semiconductor nanoribbons, and
   wherein the first conductive material provides a first layer, and the second conductive material provides a second layer, wherein the first and second layers do not have any overlap with one another in a stacked manner.

2. The integrated circuit of claim 1, wherein the first conductive material runs along a sidewall of a first dielectric wall adjacent to the first semiconductor device, and the second conductive material runs along a sidewall of a second dielectric wall adjacent to the second semiconductor device.

3. The integrated circuit of claim 1, wherein the second conductive material forms a wall between the first semiconductor device and the second semiconductor device such that the third conductive material contacts opposing sides of the wall.

4. The integrated circuit of claim 3, wherein the second conductive material includes a protruding structure adjacent to, and extending from, the wall.

5. The integrated circuit of claim 3, further comprising a first gate dielectric layer around the first plurality of semiconductor nanoribbons and a second gate dielectric layer around the second plurality of semiconductor nanoribbons, wherein no part of the first gate dielectric layer or the second gate dielectric layer extends up the sidewalls of the wall.

6. The integrated circuit of claim 1, further comprising a first high-K dielectric layer around the first plurality of semiconductor nanoribbons and a second high-K dielectric layer around the second plurality of semiconductor nanoribbons.

7. The integrated circuit of claim 6, further comprising a dielectric layer between the first semiconductor device and the second semiconductor device, wherein the second conductive material is present within a discontinuity between the first high-K dielectric layer and the second high-K dielectric layer such that the second conductive material contacts at least a portion of the dielectric layer between the first semiconductor device and the second semiconductor device.

8. The integrated circuit of claim 6, wherein the first high-K dielectric layer comprises a first concentration of lanthanum and the second high-K dielectric layer comprises a second concentration of lanthanum different from the first concentration of lanthanum.

9. The integrated circuit of claim 1, wherein the first semiconductor device is an n-channel device and the first conductive material comprises titanium, and the second semiconductor device is a p-channel device and the second conductive material comprises tungsten.

10. The integrated circuit of claim 1, wherein the third conductive material is arranged around the first plurality of semiconductor nanoribbons in an inverted 'U' shape and is arranged around the second plurality of semiconductor nanoribbons in an inverted 'U' shape.

11. A printed circuit board comprising the integrated circuit of claim 1.

12. An electronic device comprising:
    a chip package comprising one or more dies, at least one of the one or more dies comprising
       a first semiconductor device having a first plurality of semiconductor nanoribbons extending between a first source region and a first drain region;
       a second semiconductor device having a second plurality of semiconductor nanoribbons extending between a second source region and a second drain region, the second plurality of semiconductor nanoribbons extending parallel to the first plurality of semiconductor nanoribbons;
       a first conductive material surrounding at least a portion of the first plurality of semiconductor nanoribbons such that the first conductive material is between adjacent nanoribbons of the first plurality of semiconductor nanoribbons;
       a second conductive material different from the first conductive material, the second conductive material surrounding at least a portion of the second plurality of semiconductor nanoribbons such that the second conductive material is between adjacent nanoribbons of the second plurality of semiconductor nanoribbons; and a third conductive material directly contacting both the first and second conductive materials, wherein no part of the third conductive material is between the adjacent nanoribbons of the first plurality of semiconductor nanoribbons and no part of the third conductive material is between the adjacent nanoribbons of the second plurality of semiconductor nanoribbons, and wherein the first conductive material provides a first layer, and the second conductive material provides a second layer, wherein the first and second layers do not have any overlap.

13. The electronic device of claim 12, wherein the first conductive material runs along a sidewall of a first dielectric wall adjacent to the first semiconductor device, and the second conductive material runs along a sidewall of a second dielectric wall adjacent to the second semiconductor device.

14. The electronic device of claim 12, wherein the second conductive material forms a wall between the first semiconductor device and the second semiconductor device such that the third conductive material contacts opposing sides of the wall.

15. The electronic device of claim 14, wherein the second conductive material includes a protruding structure adjacent to, and extending from, the wall.

16. The electronic device of claim 12, wherein the at least one of the one or more dies further comprises a first high-K dielectric layer having a first concentration of lanthanum around the first plurality of semiconductor nanoribbons and a second high-K dielectric layer having a second concentration of lanthanum around the second plurality of semiconductor nanoribbons.

17. The electronic device of claim 12, wherein the first semiconductor device is an n-channel device and the first conductive material comprises titanium, and the second semiconductor device is a p-channel device and the second conductive material comprises tungsten.

18. An integrated circuit comprising:
a first semiconductor region having a first plurality of semiconductor nanoribbons extending in a first direction from a first source or drain region;
a second semiconductor region having a second plurality of semiconductor nanoribbons extending in the first direction from a second source or drain region, the second source or drain region being adjacent to the first source or drain region along a second direction;
a first conductive material surrounding at least a portion of the first plurality of semiconductor nanoribbons such that the first conductive material is between adjacent nanoribbons of the first plurality of semiconductor nanoribbons;
a second conductive material different from the first conductive material, the second conductive material surrounding at least a portion of the second plurality of semiconductor nanoribbons such that the second conductive material is between adjacent nanoribbons of the second plurality of semiconductor nanoribbons; and
a third conductive material directly contacting both the first and second conductive materials, wherein no part of the third conductive material is between the adjacent nanoribbons of the first plurality of semiconductor nanoribbons and no part of the third conductive material is between the adjacent nanoribbons of the second plurality of semiconductor nanoribbons, and
wherein no part of the second conductive material is between the adjacent nanoribbons of the first plurality of semiconductor nanoribbons, and no part of the first conductive material is between the adjacent nanoribbons of the second plurality of semiconductor nanoribbons.

19. The integrated circuit of claim 18, further comprising a dielectric wall extending in the first direction between the first semiconductor region and the second semiconductor region, wherein the first conductive material runs along a first sidewall of the dielectric wall adjacent to the first semiconductor region, and the second conductive material runs along a second sidewall of the dielectric wall adjacent to the second semiconductor region.

20. The integrated circuit of claim 18, wherein the second conductive material forms a wall between the first semiconductor region and the second semiconductor region such that the third conductive material contacts opposing sides of the wall.

* * * * *